(12) United States Patent
Ruiz et al.

(10) Patent No.: US 10,991,879 B2
(45) Date of Patent: Apr. 27, 2021

(54) MULTI-LEVEL PHASE CHANGE MEMORY CELLS AND METHOD OF MAKING THE SAME

(71) Applicant: Western Digital Technologies, Inc., San Jose, CA (US)

(72) Inventors: Ricardo Ruiz, San Jose, CA (US); Lei Wan, San Jose, CA (US); John Read, San Jose, CA (US); Zhaoqiang Bai, San Jose, CA (US); Mac Apodaca, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 6 days.

(21) Appl. No.: 16/453,372

(22) Filed: Jun. 26, 2019

(65) Prior Publication Data
US 2020/0411754 A1 Dec. 31, 2020

(51) Int. Cl.
*H01L 45/00* (2006.01)
*H01L 27/24* (2006.01)

(52) U.S. Cl.
CPC .......... *H01L 45/06* (2013.01); *H01L 27/2427* (2013.01); *H01L 27/2463* (2013.01);
(Continued)

(58) Field of Classification Search
CPC .................. H01L 45/1233; H01L 45/04–1691
See application file for complete search history.

(56) References Cited

U.S. PATENT DOCUMENTS 7,701,746 B2   4/2010   Meeks et al.
7,812,335 B2  10/2010   Scheuerlein
(Continued)

FOREIGN PATENT DOCUMENTS

KR   100868321 B1   11/2008
KR   20130023827 A    3/2013

OTHER PUBLICATIONS

Nirschl, T. et al., "Write Strategies for 2 and 4-Bit Multi-Level Phase-Change Memory," Electron Devices Meeting, 2007. IEDM 2007. IEEE International, IEEE: 2007; pp. 461-464.
(Continued)

*Primary Examiner* — Stephen M Bradley
(74) *Attorney, Agent, or Firm* — The Marbury Law Group PLLC

(57) ABSTRACT

A phase change memory cell includes a first electrode, a second electrode located over the first electrode, a vertical pillar structure located between the first and second electrodes, the pillar structure containing a first phase change memory (PCM) material portion, a second PCM material portion and an intermediate electrode located between the first PCM material portion and the second PCM material portion, and a resistive liner containing a first segment electrically connected in parallel to the first PCM material portion between the first electrode and the intermediate electrode, and a second segment electrically connected in parallel to the second PCM material portion between the intermediate electrode and the second electrode. The first PCM material portion has a different electrical resistance than the second PCM material portion, and the first segment of the resistive liner has a different electrical resistance than the second segment of the resistive liner.

4 Claims, 16 Drawing Sheets

(52) U.S. Cl.
CPC ........ *H01L 45/126* (2013.01); *H01L 45/1233* (2013.01); *H01L 45/144* (2013.01); *H01L 45/1675* (2013.01)

(56) References Cited

U.S. PATENT DOCUMENTS

| | | | |
|---|---|---|---|
| 8,097,498 | B2 | 1/2012 | Purayath et al. |
| 9,537,093 | B1* | 1/2017 | Lai ..................... H01L 45/1253 |
| 10,050,194 | B1 | 8/2018 | Nardi et al. |
| 10,199,434 | B1 | 2/2019 | Lee et al. |
| 10,249,683 | B1 | 4/2019 | Lille et al. |
| 10,290,804 | B2 | 5/2019 | Ruiz et al. |
| 2006/0077741 | A1* | 4/2006 | Wang ..................... H01L 45/06 365/222 |
| 2008/0248632 | A1* | 10/2008 | Youn .................. H01L 45/1233 438/483 |
| 2008/0273378 | A1* | 11/2008 | Philipp ................... H01L 45/12 365/163 |
| 2016/0056208 | A1* | 2/2016 | Pellizzer ............... H01L 27/249 257/5 |
| 2016/0163975 | A1 | 6/2016 | Petz et al. |
| 2018/0212147 | A1 | 7/2018 | Ruiz et al. |
| 2019/0189688 | A1 | 6/2019 | Lille |

OTHER PUBLICATIONS

Braga, S. et al., "Voltage-Driven Partial-Reset Multilevel Programming in Phase-Change Memories," IEEE Transactions on Electron Devices, vol. 57, No. 10, Oct. 2010, pp. 2556-2563.

Feng, J. et al., "Design of Multi-States Storage Medium for Phase Change Memory," Japanese Journal of Applied Physics, vol. 46, No. 9A, 2007, pp. 5724-5728.

Papandreou, N. et al. "Drift-Tolerant Multilevel Phase-Change Memory," Memory Workshop (IMW), 2011 3rd IEEE International, IEEE: 2011; pp. 1-4.

Athamanathan, A. et al., "Multilevel-Cell Phase-Change Memory: A Viable Technology," IEEE Journal on Emerging and Selected Topics in Circuits and Systems, vol. 6, No. 1, March 2016, pp. 87-100.

Kim, S. et al., "A Phase Change Memory Cell with Metal Nitride Liner as a Resistance Stabilizer to Reduce Read Current Noise for MLC Optimization," IEEE Transactions on Electron Devices, vol. 63, No. 10, October 2016, pp. 3922-3927.

Wong, H.-S. P.; et al., "Phase Change Memory," Proceedings of the IEEE 2010, vol. 98, No. 12 pp. 2201-2227, (2010).

Koelmans, W. W. et al., "Projected Phase-Change Memory Devices," Nature communications 2015, 7 pages, (2015).

Zhang, Y. et al., "Multi-Bit Storage in Reset Process of Phase Change Access Memory (Pram)," Phys. Stat. Sol. (RRL)—Rapid Research Letters 2007, vol. 1, No. 1, pp. R28-R30, (2007).

U.S. Appl. No. 15/898,571, filed Feb. 17, 2018, SanDisk Technologies LLC.

U.S. Appl. No. 16/002,169, filed Jun. 7, 2018, SanDisk Technologies LLC.

U.S. Appl. No. 16/002,243, filed Jun. 7, 2018, SanDisk Technologies LLC.

U.S. Appl. No. 16/021,694, filed Jun. 28, 2018, SanDisk Technologies LLC.

U.S. Appl. No. 16/410,326, filed May 13, 2019, SanDisk Technologies LLC.

U.S. Appl. No. 16/410,376, filed May 13, 2019, SanDisk Technologies LLC.

Notification of Transmittal of the International Search Report and Written Opinion of the International Search Authority for International Patent Application No. PCT/US2020/021854, dated Jul. 2, 2020, 11 pages.

* cited by examiner

FIG. 2A

| State | R2 | R1 |
|---|---|---|
| 00 | R2high | R1high |
| 01 | R2high | R1low |
| 10 | R2low | R1high |
| 11 | R2low | R1low |

FIG. 2B

| State | $R_{comp}$ | $R_{ccm}$ | $R_2$ | $R_1$ | $R_{eq}$ |
|---|---|---|---|---|---|
| 00 | $xnRo$ | $nRo$ | $xyRo$ | $yRo$ | $\frac{nRo(1+x)y}{n+y}$ |
| 01 | $xnRo$ | $Ro$ | $xyRo$ | $yRo$ | $\frac{Ro\,y(y+n(1+x+xy))}{(1+y)(n+y)}$ |
| 10 | $xRo$ | $nRo$ | $xyRo$ | $yRo$ | $\frac{Ro\,y(xy+n(1+x+y))}{(1+y)(n+y)}$ |
| 11 | $xRo$ | $Ro$ | $xyRo$ | $yRo$ | $\frac{Ro(1+x)y}{1+y}$ |

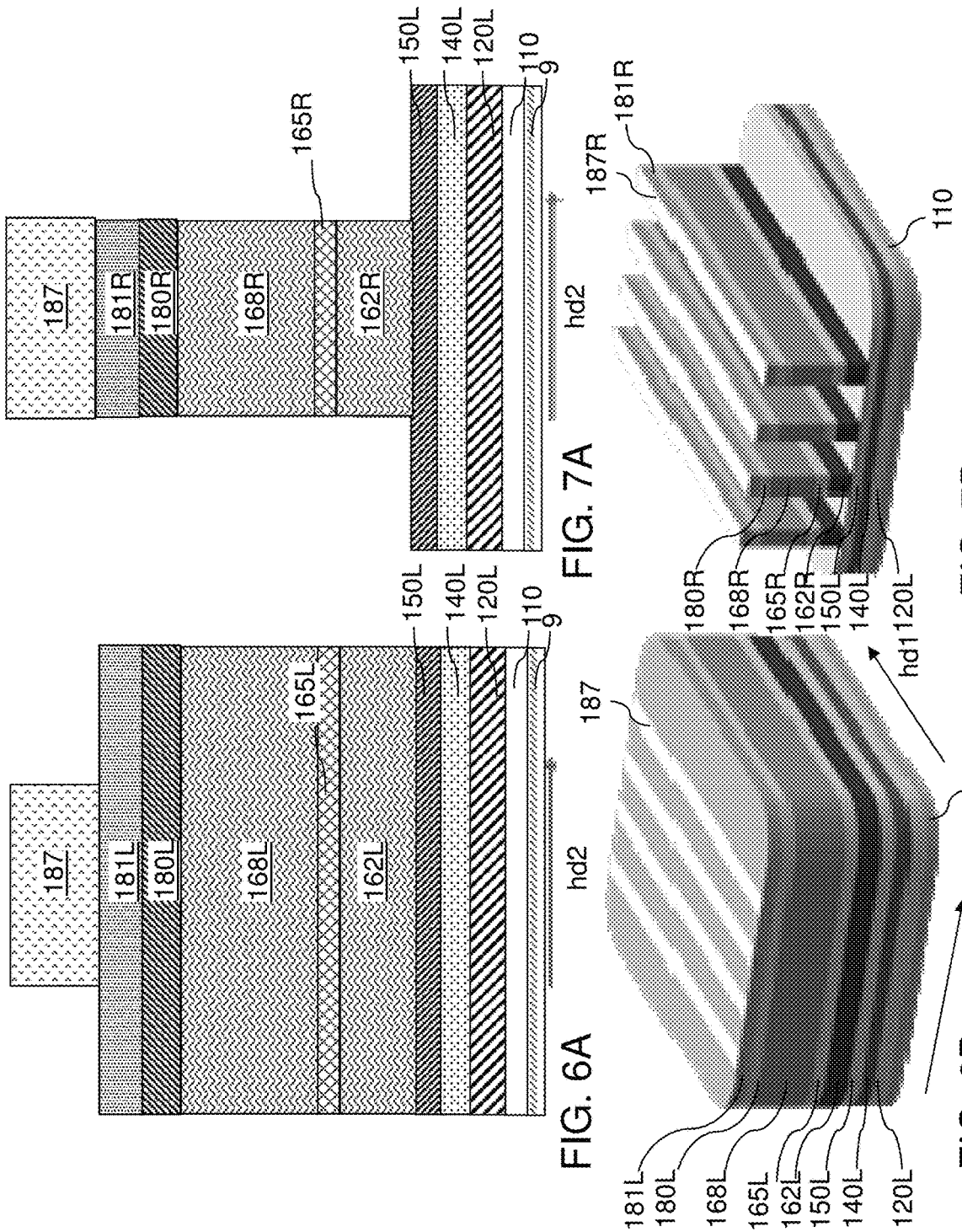

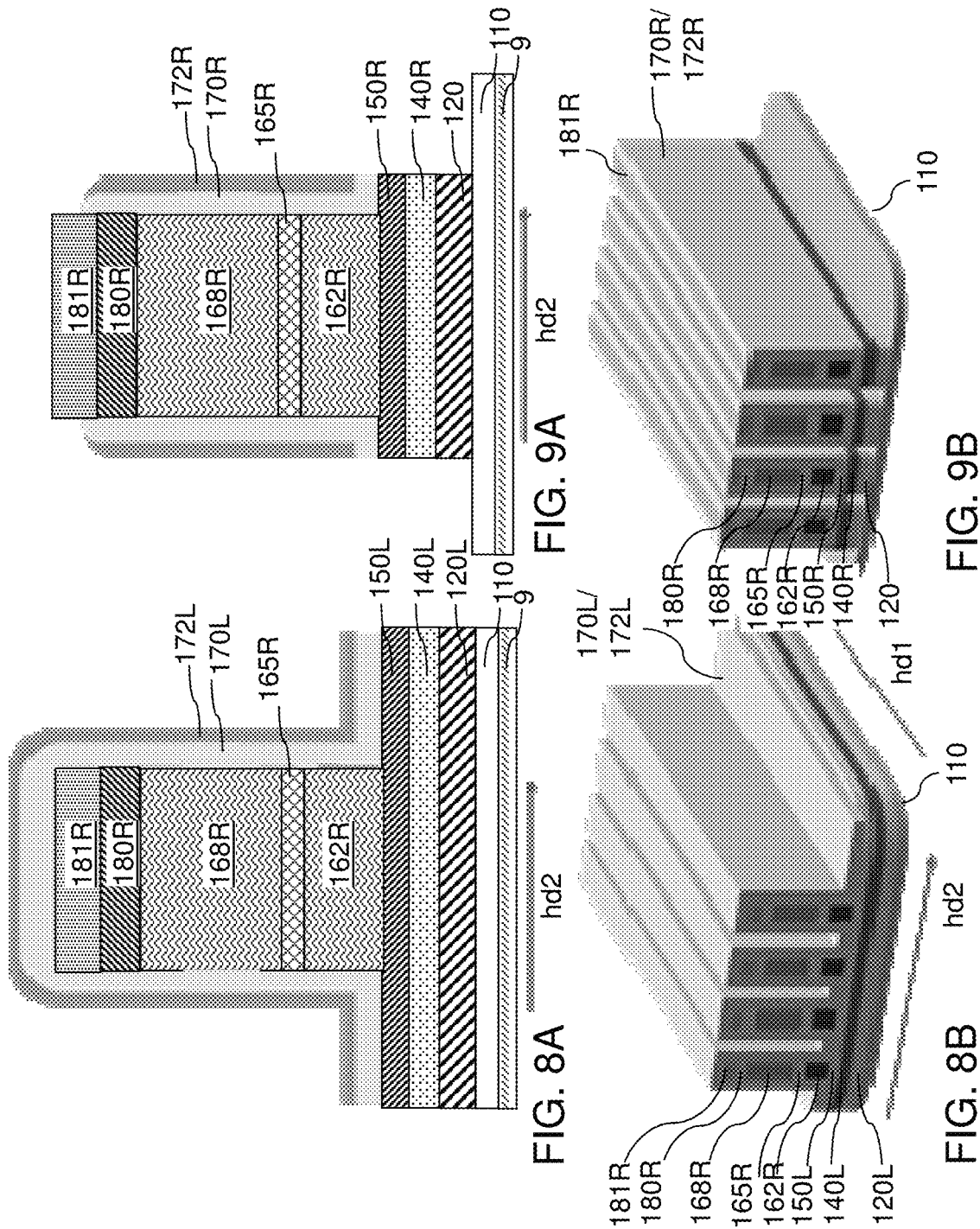

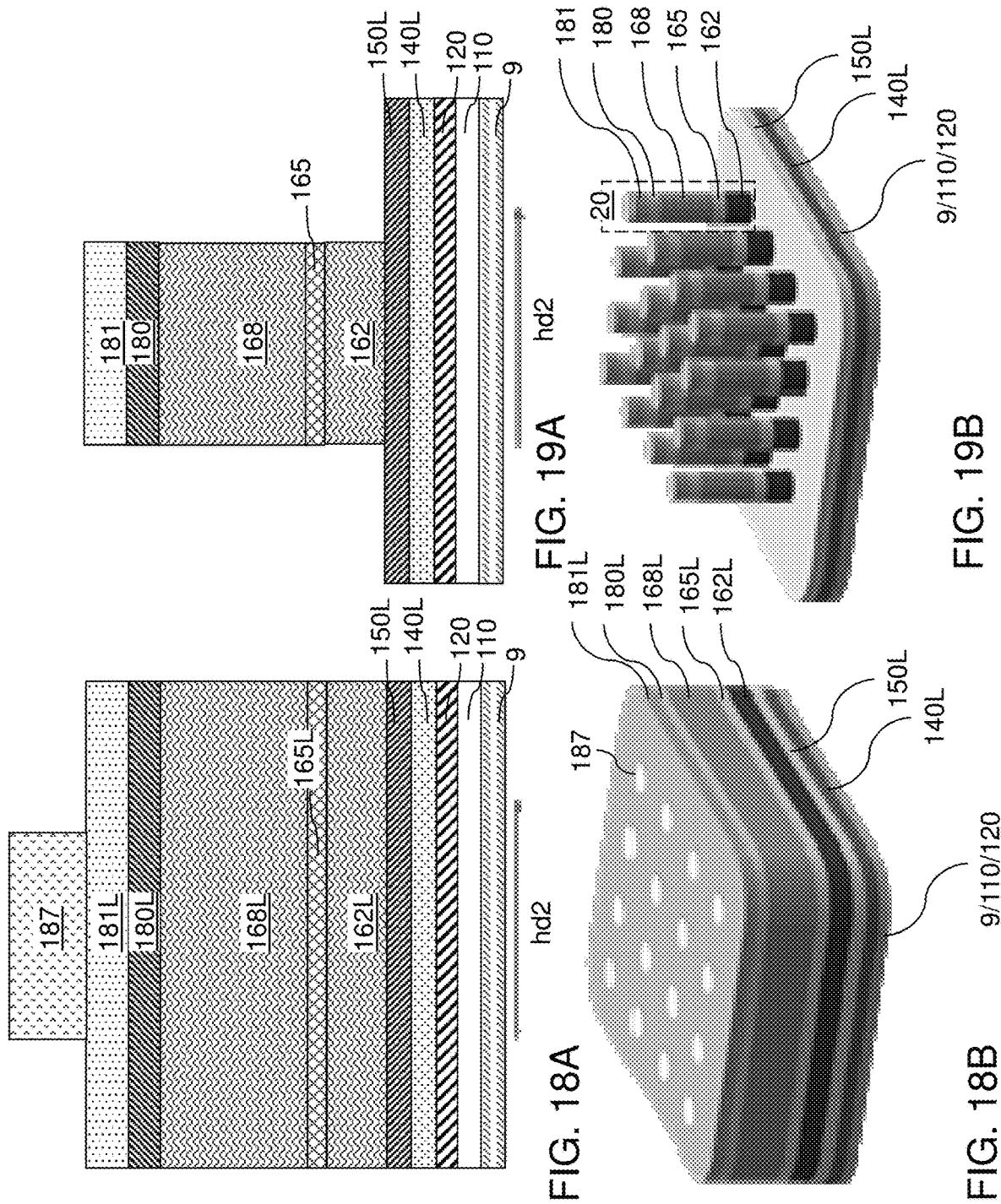

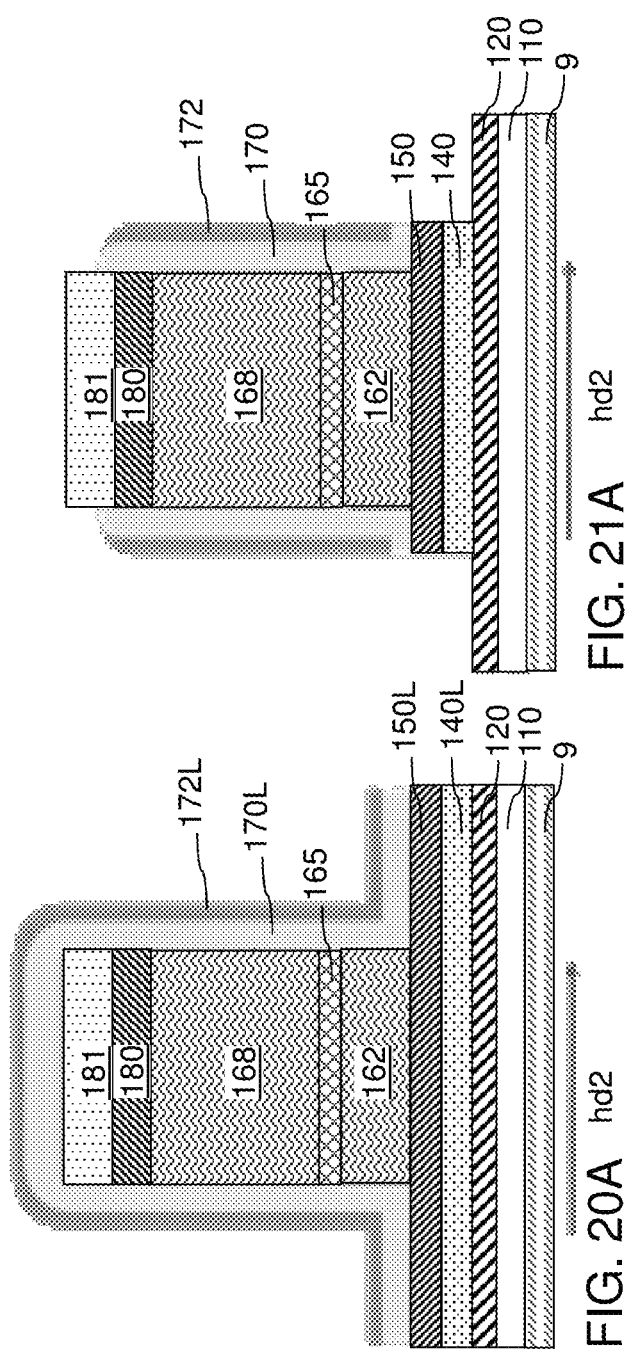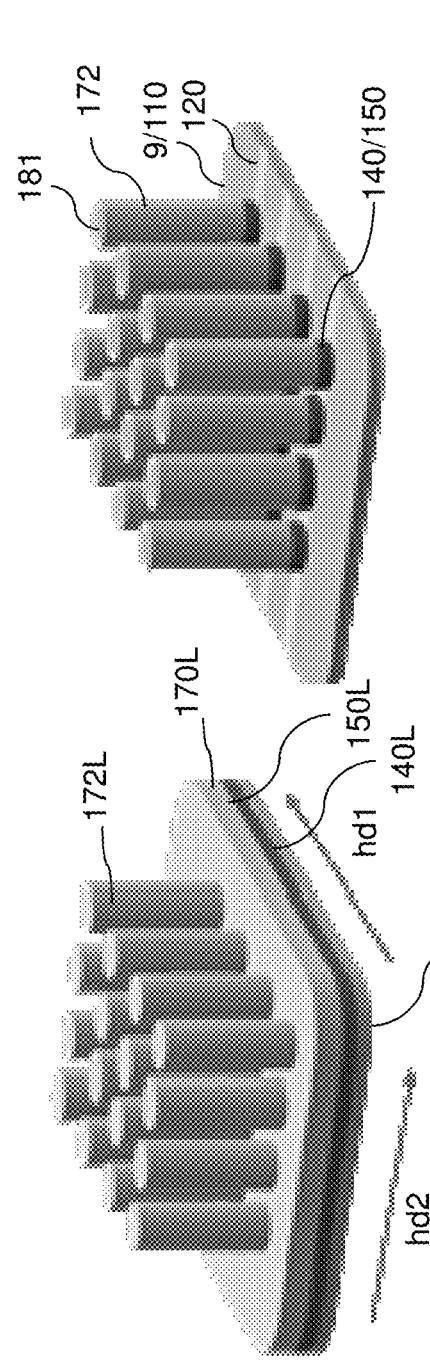

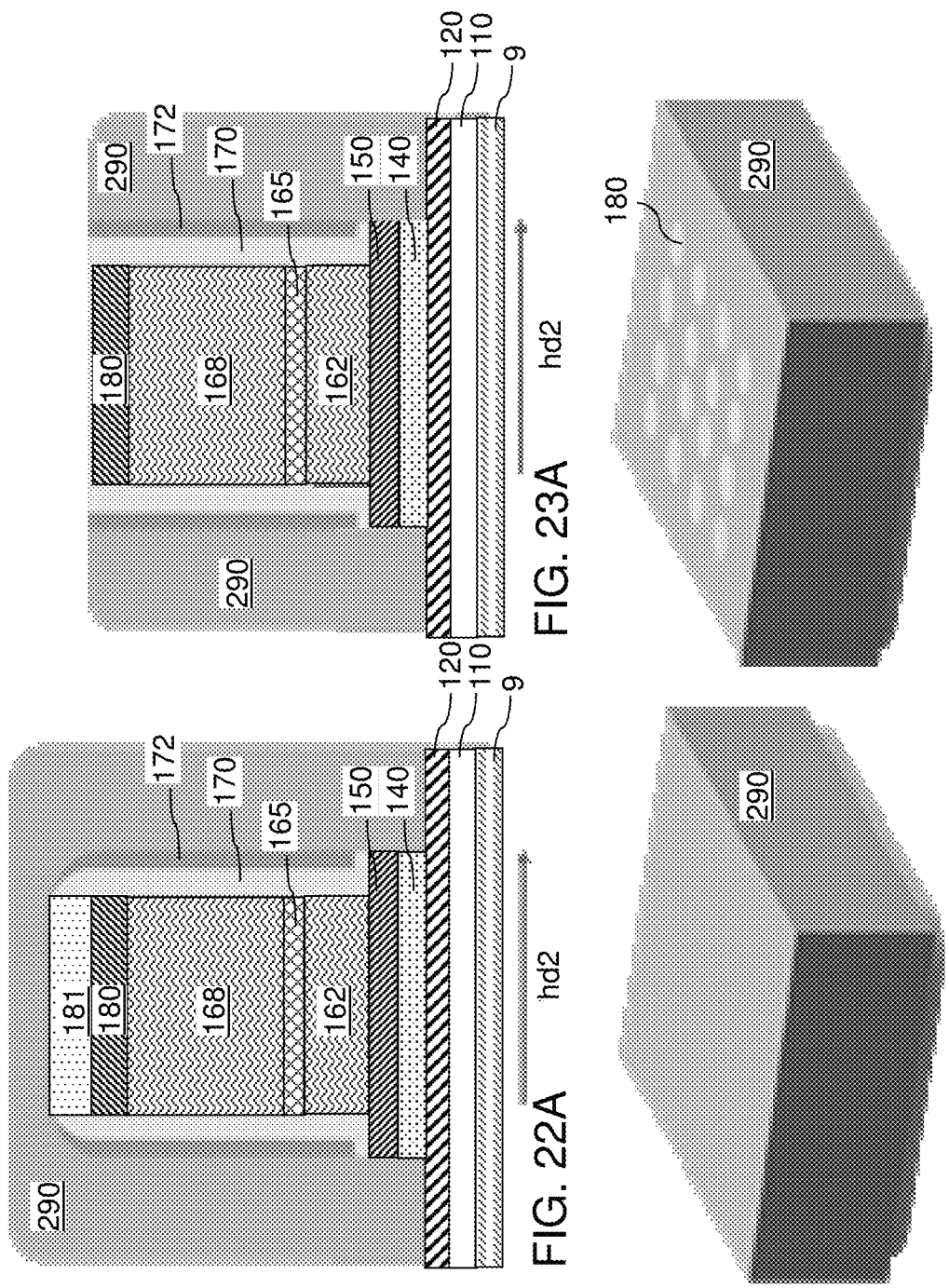

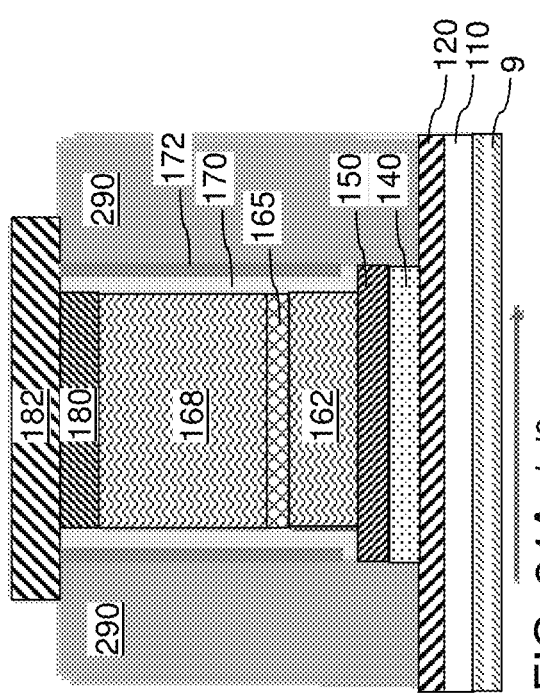
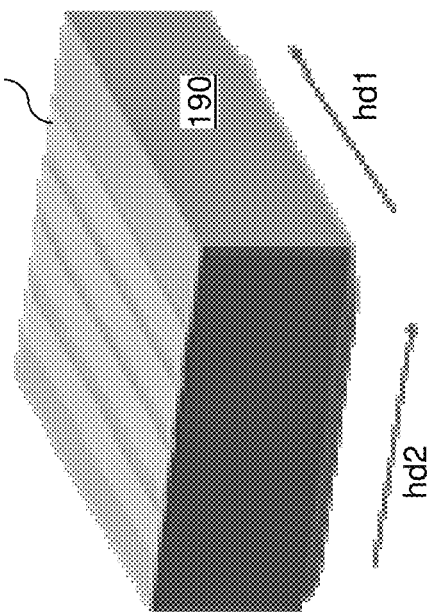
FIG. 24A
FIG. 24B

MULTI-LEVEL PHASE CHANGE MEMORY CELLS AND METHOD OF MAKING THE SAME

FIELD

The present disclosure relates generally to the field of semiconductor devices and specifically to a memory device including multi-level phase change memory cells and methods of forming the same.

BACKGROUND

A phase change memory (PCM) device (also known as a phase change random access memory "PCRAM" or "PRAM") is a type of non-volatile memory device that stores information as a resistive state of a material that may be in different resistive states corresponding to different phases of the material. The different phases may include an amorphous state having high resistivity and a crystalline state having low resistivity (i.e., a lower resistivity than in the amorphous state).

SUMMARY

According to an embodiment of the present disclosure, a memory device comprising at least one phase change memory cell is provided. The phase change memory cell includes a first electrode located over a substrate, a second electrode located over the first electrode, a pillar structure located between the first and second electrodes and extending along a vertical direction perpendicular to the substrate, the pillar structure containing a first phase change memory (PCM) material portion, a second PCM material portion and an intermediate electrode located between the first PCM material portion and the second PCM material portion, and a resistive liner containing a first segment electrically connected in parallel to the first PCM material portion between the first electrode and the intermediate electrode, and a second segment electrically connected in parallel to the second PCM material portion between the intermediate electrode and the second electrode. The first PCM material portion has a different electrical resistance than the second PCM material portion, and the first segment of the resistive liner has a different electrical resistance than the second segment of the resistive liner.

According to another embodiment of the present disclosure, a method of forming a memory device includes forming a first electrode, forming a pillar structure on the first electrode, wherein the pillar structure comprises a first phase change memory (PCM) material portion, an intermediate electrode, a second PCM material portion that are arranged along a vertical direction, forming a resistive liner located on at least one sidewall of the pillar structure, and forming a second electrode on the pillar structure. The first PCM material portion has a different electrical resistance than the second PCM material portion, and the first segment of the resistive liner has a different electrical resistance than the second segment of the resistive liner.

BRIEF DESCRIPTION OF THE DRAWINGS

FIG. 2A is a table representing the correlation between programmed states of the exemplary phase change memory cell of FIG. 1 and the resistive states of the phase change memory material portions therein according to an embodiment of the present disclosure.

FIG. 2B is a table representing target resistance values for various components and for the total resistance for the exemplary phase change memory cell of FIG. 1 according to an embodiment of the present disclosure.

FIG. 6A is a vertical cross-sectional view of the first exemplary structure after application and patterning of a photoresist layer according to an embodiment of the present disclosure.

FIG. 6B is a perspective view of the first exemplary structure of FIG. 6A.

FIG. 7A is a vertical cross-sectional view of the first exemplary structure after patterning the first PCM material layer, the intermediate electrode material layer, the second PCM material layer, and the second electrode material layer into rail structures according to an embodiment of the present disclosure.

FIG. 7B is a perspective view of the first exemplary structure of FIG. 7A.

FIG. 8A is a vertical cross-sectional view of the first exemplary structure after formation of a resistive liner layer and an optional dielectric liner layer according to an embodiment of the present disclosure.

FIG. 8B is a perspective view of the first exemplary structure of FIG. 8A.

FIG. 9A is a vertical cross-sectional view of the first exemplary structure after an anisotropic etch process that forms resistive liners, optional dielectric liners, first electrodes, selector material portions, and first electrically conductive lines according to an embodiment of the present disclosure.

FIG. 9B is a perspective view of the first exemplary structure of FIG. 9A.

FIG. 18A is a vertical cross-sectional view of the second exemplary structure after application and patterning of a photoresist layer according to an embodiment of the present disclosure.

FIG. 18B is a perspective view of the second exemplary structure of FIG. 18A.

FIG. 19A is a vertical cross-sectional view of the second exemplary structure after patterning the second electrode material layer, the second PCM material layer, the intermediate electrode material layer, and the first PCM material layer into pillar structures according to an embodiment of the present disclosure.

FIG. 19B is a perspective view of the second exemplary structure of FIG. 19A.

FIG. 20A is a vertical cross-sectional view of the second exemplary structure after formation of a resistive liner layer and an optional dielectric liner layer according to an embodiment of the present disclosure.

FIG. 20B is a perspective view of the second exemplary structure of FIG. 20A.

FIG. 21A is a vertical cross-sectional view of the second exemplary structure after an anisotropic etch process that forms resistive liners, optional dielectric liners, first electrodes, and selector material portions according to an embodiment of the present disclosure.

FIG. 21B is a perspective view of the second exemplary structure of FIG. 21A.

FIG. 22A is vertical cross-sectional view of the second exemplary structure after formation of a dielectric matrix layer according to an embodiment of the present disclosure.

FIG. 22B is a perspective view of the second exemplary structure of FIG. 22A.

FIG. 23A is a vertical cross-sectional view of the second exemplary structure after planarization of the dielectric matrix layer according to an embodiment of the present disclosure.

FIG. 23B is a perspective view of the second exemplary structure of FIG. 23A.

FIG. 24A is a vertical cross-sectional view of the second exemplary structure after formation of a second electrically conductive lines according to an embodiment of the present disclosure.

FIG. 24B is a perspective view of the second exemplary structure of FIG. 24A.

DETAILED DESCRIPTION

Figure 1:
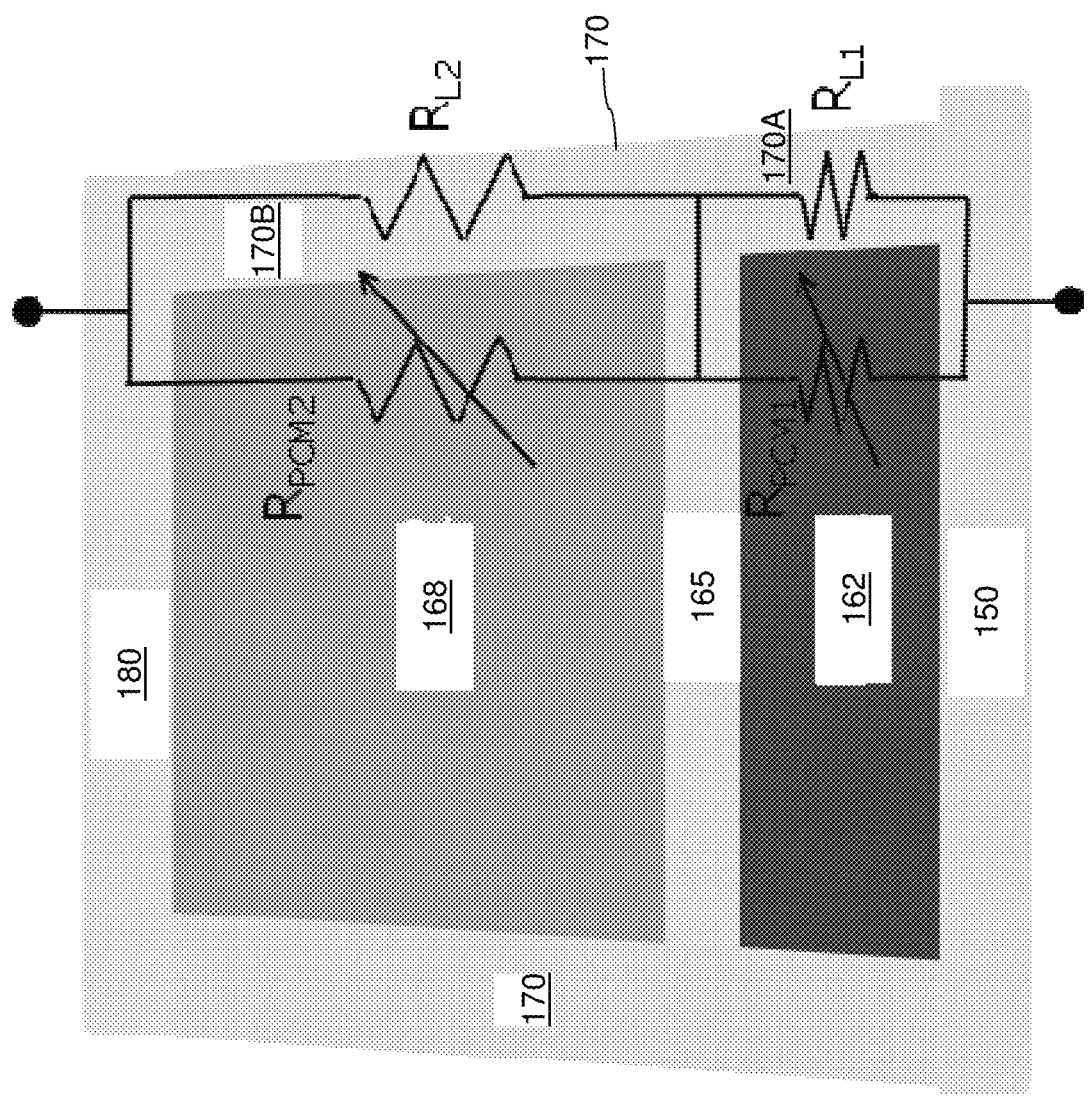
FIG. 1 is a vertical cross-sectional view of an exemplary phase change memory cell of the present disclosure and a schematic circuit diagram juxtaposed on the exemplary phase change memory cell according to an embodiment of the present disclosure.

As discussed above, the present disclosure is directed to a memory device including multi-level phase change memory cells and methods of forming the same, the various embodiments of which are described below. Embodiments of the present disclosure may be used to provide storage class memory media based on phase change memory materials.

A PCM device (also known as a phase change random access memory "PCRAM" or "PRAM") is a type of non-volatile memory device that stores information as a resistive state of a material that may be in different resistive states corresponding to different phases of the material. The different phases may include an amorphous state having high resistivity and a crystalline state having low resistivity (i.e., a lower resistivity than in the amorphous state). The transition between the amorphous state and the crystalline state may be induced by controlling the rate of cooling after application of an electrical pulse that renders the phase change memory material amorphous in a first part of a programming process. The second part of the programming process includes control of the cooling rate of the phase change memory material. If rapid quenching occurs, the phase change memory material may cool into an amorphous high resistivity state. If slow cooling occurs, the phase change memory material may cool into a crystalline low resistivity state.

Phase change memories (PCM) are positioned as a viable non-volatile memory (NVM) to occupy a spot in the memory "performance vs. value map" somewhere in the range between Flash and DRAM. The chalcogenide materials that are commonly used in PCMs enjoy advantageous attributes such as large set/reset resistivity ratios and fast switching speeds down to about 20 ns. In addition to performance attributes, value may be added (or cost/bit reduced) by scaling down the minimum lithographic dimension "F" and/or by increasing bit density per each cell area, which may be about $4F^2$.

Multilevel cell (MLC) phase change memories (PCM) represent one plausible solution to increase bit density per $4F^2$ since multilevel cells make it possible to store more than one bit per cell. In multi-level PCM cell, the chalcogenide material in the cell is capable of storing more than two states, represented by 3 or more resistance values.

Chalcogenide phase change alloys, and the memory cells made from them, however, have some limitations that have prevented the successful realization of commercial MLC PCMs. These challenges include resistance drift (the phenomenon by which the resistance value of the amorphous state drifts over time), cell variability (the difficulty of achieving the exact same values in a population of cells within the array), and a sufficiently short write time that minimizes the need of incremental step programming pulses (ISPP), which is a writing technique in which a state is written and verified in incremental steps until the desired value is reached).

Prior demonstrations of multilevel cell PCMs commonly involved a single, unconfined or confined, volume of crystalline chalcogenide material. Amorphization of a variable fraction of the chalcogenide by applying a fast electrical pulse, increases the overall electrical resistance of the cell. By modulating the amount of amorphous material in the cell, various values of electrical resistance may be accomplished. The values of electrical resistance may then be grouped into three or more distinct ranges wherein each range is assigned a discrete value to store data (e.g., 0, 1, 2 . . . etc.). Because there are three or more distinct groups, each cell is capable of storing more than one bit.

While the resistance values of the cell may be grouped into distinct ranges, each cell may span the entire range of resistances in a continuous or "analog" fashion as the amount of amorphous material is increased within the cell. This behavior together with cell variability and drift results in uncertainty on the exact programmed values for a given programming signal thus making it necessary to program the multilevel cell via incremental step pulse programming (ISPP). In ISPP, the programming signal is gradually increased and the cell is read to verify the programmed value until the desired target is reached. However, to achieve these results, the speed performance is degraded.

An ideal MLC PCM that does not compromise speed performance should be able to reach and retain the targeted programming value in a single write pulse or, at most, within a single clock cycle. The most significant challenges for obtaining such multi-level cell phase change memory devices include: resistance drift (the phenomenon by which the resistance value of the amorphous state drifts over time), cell variability (the difficulty of achieving the exact same values in a population of cells within the array), and achieving a sufficiently short write time that minimizes the need of incremental step programming pulses. While various attempts have been made to address these significant challenges for multi-level cell phase change memory devices, no known solution exists that addresses all of the challenges simultaneously and successfully. The present disclosure is directed to a multilevel cell capable of storing three or more states in distinct discrete values that minimize cell variability while eliminating or minimizing drift in electrical resistance and the need for incremental step pulse programming.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are used merely to identify similar elements, and different ordinals may be used across the specification and the claims of the instant disclosure. A same reference numeral refers to a same element or a similar element. Unless otherwise noted, elements with a same reference numeral are presumed to have a same material composition. As used herein, all thermoelectric properties and thermal properties are measured at 300 degrees Celsius unless otherwise specified. Consequently, the reference temperature (i.e., measurement temperature) for asymmetric thermoelectric heat generation and other thermoelectrical properties and thermal properties is 300 degrees Celsius in the specification and in the claims unless expressly specified otherwise.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material"

refers to a conductive material including at least one metallic element therein. All measurements for electrical conductivities are made at the standard condition.

According to an embodiment of the present disclosure, a multi-level phase change memory (PCM) cell is provided, which incorporates two or more discrete, physically separated phase change material portions. As used herein, a "multi-level" memory cell refers to a memory cell that is configured to store three or more states therein. A resistor may be provided adjacent to each phase change memory material portion in a parallel connection. Parallel connections of a discrete phase change memory material portion and a resistor may be connected to one another in a series connection. The multi-level PCM cells of the present disclosure provides semi-discrete resistance values for programmed states, which makes it easier to program a target state without incremental step programming pulses. Further, the resistors coupled to the PCM material portions may help reduce resistance drift in programmed states.

Referring to FIG. 1, a schematic circuit diagram is juxtaposed on an exemplary phase change memory cell of the present disclosure. The exemplary phase change memory cell includes a first electrode 150 that may be formed on a substrate (not shown), a pillar structure (162, 165, 168) located on the first electrode 150, a resistive liner 170 located over (e.g., directly on or offset from) the sidewalls of the pillar structure (162, 165, 168), and a second electrode 180. The pillar structure (162, 165, 168) comprises a first phase change memory (PCM) material portion 162, an intermediate electrode 165, a second PCM material portion 168 that are arranged along a vertical direction. Each PCM material portion (162, 168) is represented by a variable resistor.

The first PCM material portion 162 may have a first PCM resistance $R_{PCM1}$, the second PCM material portion 168 may have a second PCM resistance $R_{PCM2}$, a first segment 170A of the resistive liner 170 located over sidewalls of the first PCM material portion 162 may have a first liner resistance $R_{L1}$, and a second segment 170B of the resistive liner 170 located over sidewalls of the second PCM material portion 168 may have a second liner resistance $R_{L1}$. Each resistance of elements herein is measured along the vertical direction, i.e., along a direction that is perpendicular to an interface of the intermediate electrode 165 with the first PCM material portion 162 or with the second PCM material portion 168. Thus, the first liner resistance $R_{L1}$ is the electrical resistance along the vertical direction of the first segment 170A of the resistive liner 170 located on the first PCM material portion 162, and the second liner resistance $R_{L2}$ is the electrical resistance along the vertical direction of the second segment 170B of the resistive liner 170 located on the second PCM material portion 168. According to an embodiment of the present disclosure, the first liner resistance $R_{L1}$ may be less than the electrical resistance along the vertical direction of an amorphous state of the first PCM material portion 162 (i.e., the value of the first PCM resistance $R_{PCM1}$ when the first PCM material portion 162 is in an amorphous state), and may be less than the electrical resistance along the vertical direction of an amorphous state of the second PCM material portion 168 (i.e., the value of the second PCM resistance $R_{PCM2}$ when the second PCM material portion 168 is in an amorphous state), and may have greater than the electrical resistance along the vertical direction of a crystalline state of the first PCM material portion 162 (i.e., the value of the first PCM resistance $R_{PCM1}$ when the first PCM material portion 162 is in a crystalline state).

The first PCM material portion 162 and the first segment of the resistive liner 170 forms a parallel connection between the first electrode 150 and the intermediate electrode 165. The second PCM material portion 168 and the second segment of the resistive liner 170 forms a parallel connection between the intermediate electrode 165 and the second electrode 180. Optionally, one or more combinations of an additional intermediate electrode and an additional PCM material portion may be inserted between the second PCM material portion 168 and the second electrode 180. In this case, the resistive liner 170 may be extended to the bottom surface of the resistive liner. In this case, one or more parallel connections of an additional PCM material portion and a segment of the resistive liner 170 may be provided between a vertically neighboring pair of electrodes, which may be an additional intermediate electrode and the second electrode or a pair of additional intermediate electrodes.

While FIG. 1 illustrates a series connection of two parallel connections of a discrete phase change memory material portion and a resistor, embodiments are expressly contemplated herein in which three or more parallel connections of a discrete phase change memory material portion and a resistor are connected in a series connection within a multi-level phase change memory cell.

Generally, the multi-level phase change memory cell includes two discrete volumes of phase change materials separated by an intermediate electrode 165 and surrounded by the resistive liner 170. The resistive liner 170 may be viewed as a series connection of two resistors comprising a first segment of the resistive liner 170 located on sidewalls of the first PCM material portion 162 and a second segment of the resistive liner 170 located on sidewalls of the second PCM material portion 168. Each PCM material portion (162, 168) may have a high resistance state and a low resistance state. Thus, the combination of the PCM material portion (162, 168) may provide a total of four possible combinations of resistance values, which correspond to four distinct resistive states of the multi-level phase change memory cell of the present disclosure.

Referring to FIG. 2A, the various resistive states of the multi-level phase change memory cell of the present disclosure are correlated with resistive states of the first PCM material portion 162 and the second PCM material portion 168. The four resistive states are represented by 00, 01, 10, and 11. R2high refers to a high resistance value for the second PCM material portion 168, R2low refers to a low resistance value for the second PCM material portion 168, R1high refers to a high resistance value for the first PCM material portion 162, and R1low refers to a low resistance value for the first PCM material portion 162. The material compositions, shapes, and dimensions of each PCM material portion (162, 168) may be selected to provide suitable separation among the resistance levels of the four states illustrated in FIG. 2A.

Referring to FIG. 2B, nominal values for the second PCM resistance $R_{PCM2}$, the first PCM resistance $R_{PCM1}$, the second liner resistance $R_{L1}$, and the first liner resistance $R_{L1}$, and the total resistance $R_{eq}$ of the combination of the pillar structure (162, 165, 168) and the resistive liner 170 are tabulated. The nominal resistance of the low resistance state (i.e., a crystalline state) of the first PCM material portion 162 is represented by $R_o$. The nominal resistance of the low resistance state (i.e., a crystalline state) of the second PCM material portion 168 is represented by $xR_o$, i.e., x times $R_o$, in which x is greater than 1.0. In an illustrative example, a value of x greater than 1.0 may be provided by using a same phase change memory material with same resistivity and same cross sectional area for the first PCM material portion 162 and the second PCM material portion 168 and making the second PCM material portion 168 "x" times thicker than the first PCM material portion 162. For simplicity, the following examples will assume a multilevel cell where first and second PCM materials are made of the same material with same resistivity with both volumes having same cross sectional area such that resistance values scale linearly with the thickness ratio of the two materials. For those skilled in the art, it would be evident that the corresponding resistance states of FIG. 2B for cases where both materials are made of different alloys having different resistivities or where the cross sectional dimensions are different, would need to be calculated accordingly.

The nominal value for the ratio of the resistivity of the amorphous state of the first PCM material portion 162 and the second PCM material portion 168 to the resistivity of the crystalline state of the first PCM material portion 162 and the second PCM material portion 168 is herein represented by the number n. Thus, the nominal value for the resistance of the first PCM material portion 162 in the high resistance state is $nR_o$, and the nominal value for the resistance of the second PCM material portion 168 in the high resistance state is $xnR_o$. The resistive liner 170 may include a resistive material that conformally surrounds the entire pillar structure (162, 165, 168) with a uniform lateral thickness. The resistive liner 170 includes a first segment that underlies the intermediate electrode 165 and a second segment that overlies the intermediate electrode 165. The first segment of the resistive liner 170 has the first liner resistance $R_{L1}$, and the second segment of the resistive liner 170 has the second liner resistance $R_{L2}$. The material composition and the geometry of the resistive liner 170 may be selected such that $R_{L1}=yR_o$, in which y>x. In case the resistive liner 170 and both PCM materials 162 and 168 have a uniform horizontal cross-sectional area throughout, the second liner resistance $R_{L2}$ may be $xyR_o$.

The nominal values for the total resistance of the combination of the pillar structure (162, 165, 168) and the resistive liner 170 for the four different resistive states. Suitable resistance differentials selected from the various values of the total resistance of the combination of the pillar structure (162, 165, 168) and the resistive liner 170 may be used to provide sensing of the various states of the multi-level PCM cell of the present disclosure. In an illustrative example in which x=2, all states may be equally separated from their adjacent states by a resistance differential ΔR' given by:

$$\Delta R' = \frac{(n-1)y^2}{(1+y)(n+y)} R_o.$$

Figure 3A:
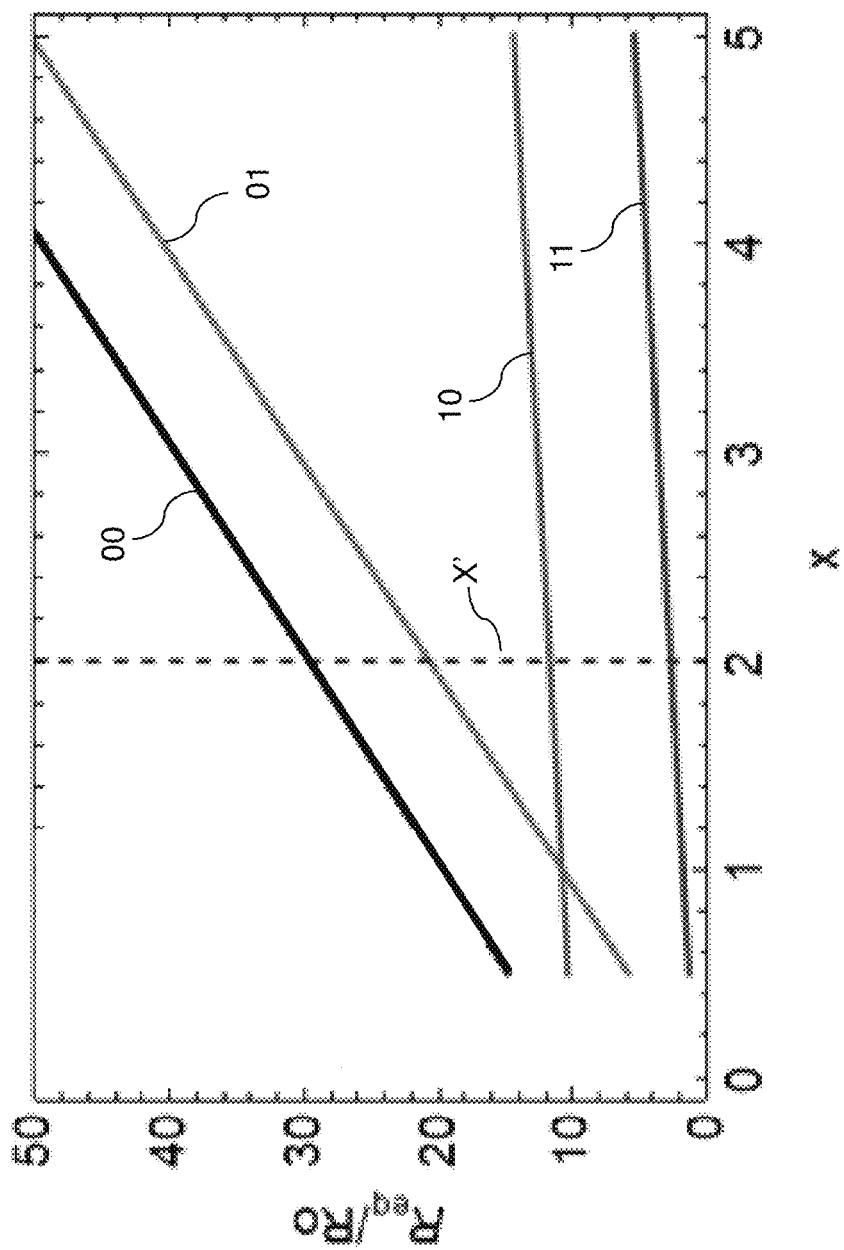
FIG. 3A is a graph representing resistance states of a multilevel phase change memory cell as a function of the scaling factor x when n=1,000 and y=10 according to an embodiment of the present disclosure.

Referring to FIG. 3A, the nominal resistance values for the four resistance states of the multilevel phase change memory cell of FIG. 1 are plotted as a function of the value of x when n=1,000 and y=10. The value of x may function as a scaling factor in tuning the nominal resistance values for the various states of the multi-level phase change memory cell of the present disclosure. The vertical dotted line corresponds to a selected value x' of 2.0 for the scaling factor x. The vertical distance between the 00 and 01 states remains constant regardless of the value of x in FIG. 3A. The vertical distance between the 10 and 11 states remains constant regardless of the value of x in FIG. 3A. At x=2, all three consecutive differences are equidistant along the vertical direction with a value ΔR' discussed above. Generally, it is desirable to increase ΔR' to facilitate discrimination of the four different resistive states of the multi-level phase change memory cell. Those skilled in the art would note that FIG. 3 and the optimum value of ΔR' would need to be re-calculated accordingly for cases in which both PCM materials are chosen from different alloys with different resistivities and/or for which both volumes have different cross-sectional areas.

Figure 3B:
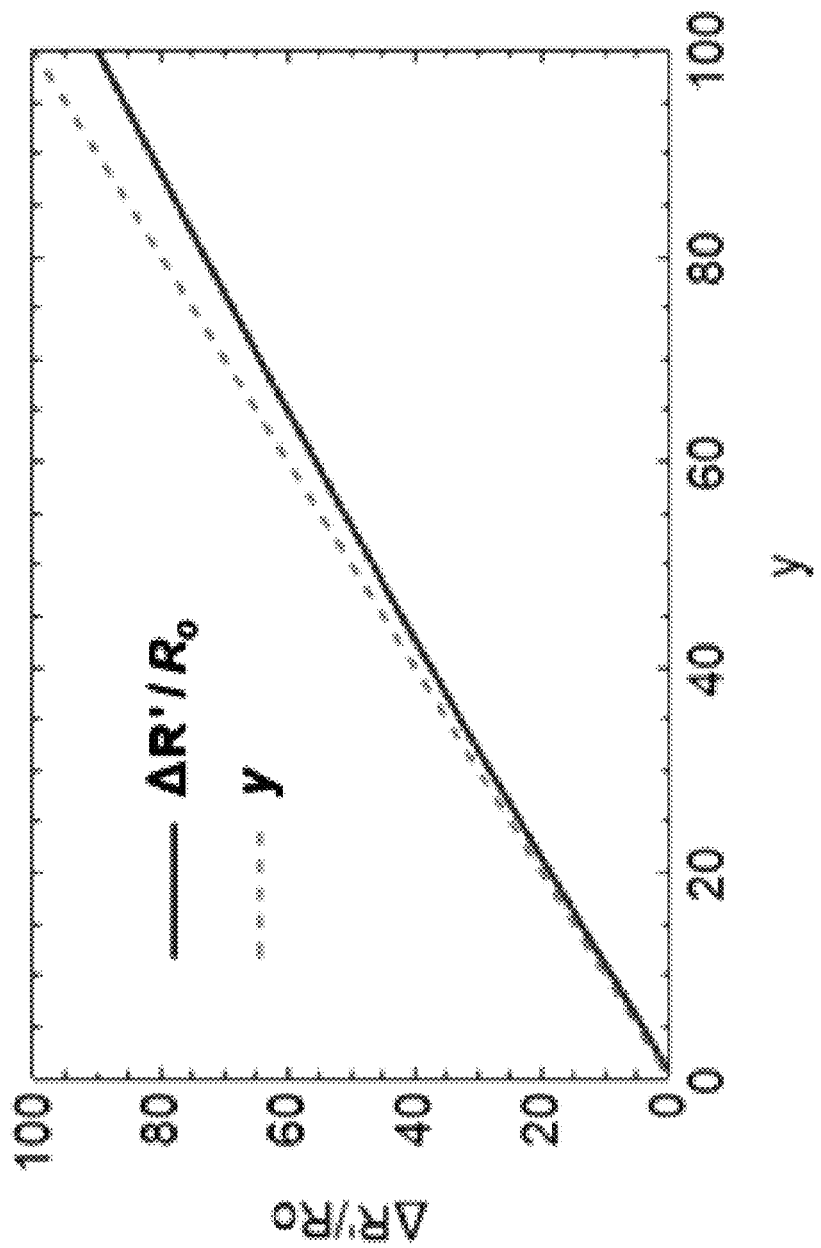
FIG. 3B is a graph representing ΔR' as a function of the linear factor y when x=2 and n=1,000 according to an embodiment of the present disclosure.

Referring to FIG. 3B, ΔR' is plotted a function of the linear factor y when x=2 and n=1,000. The equation for ΔR' above and the plot in FIG. 3B demonstrate that ΔR' increases monotonically with the value for y, and that $\Delta R'/R_o$ is less than y. In other words, the value of y is an upper ceiling for the value of $\Delta R'/R_o$.

Figure 3C:
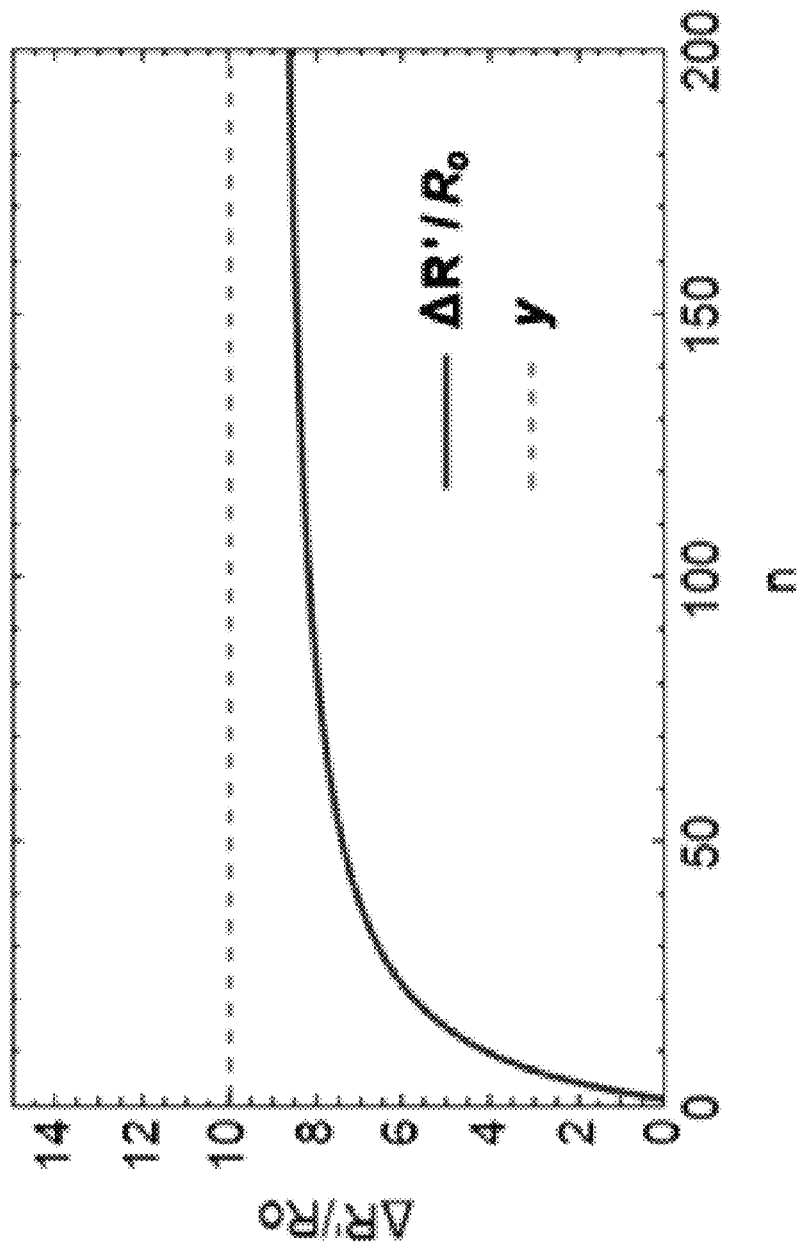
FIG. 3C is a graph representing ΔR' as a function of the resistivity factor n when x=2 and y=10 according to an embodiment of the present disclosure.

Referring to FIG. 3C, ΔR' is shown as a function of the resistivity factor n when x=2 and y=10. ΔR' increases quickly with an increasing value of n. The value of y is an upper ceiling for $\Delta R'/R_o$. Most of the gains in ΔR' may be realized when n≥50y.

Various modifications may be made to the multi-level phase change memory cell of FIG. 1. For example, different phase change memory materials may be used for the first PCM material portion 162 and the second PCM material portion 168 such that the first PCM material portion 162 and the second PCM material portion 168 have different melting temperatures or different glass transition temperatures. Additionally, or alternatively, the first PCM material portion 162 and the second PCM material portion 168 may have different crystallization dynamics. Further, as discussed above, more than two PCM material portions may be stacked to provide $2^k$ different resistive states in which k is 3, 4, 5, or a greater integer.

The basic structure of a multi-level phase change memory cell of FIG. 1, or a derivative thereof, may be implemented in many different configurations. For example, a multi-level phase change memory cell of the present disclosure may incorporate a selector device to provide a unit cell that is replicated as a two-dimensional array in a cross-point array configuration. In one embodiment, the unit cell may have a shape of a rectangular pillar, a circular pillar, or an elliptical pillar.

Figure 4A:
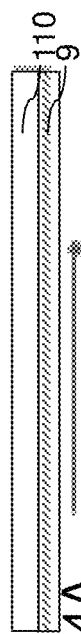
FIG. 4A is a vertical cross-sectional view of a first exemplary structure for forming a two-dimensional array of phase change memory cells according to an embodiment of the present disclosure.
Figure 4B:
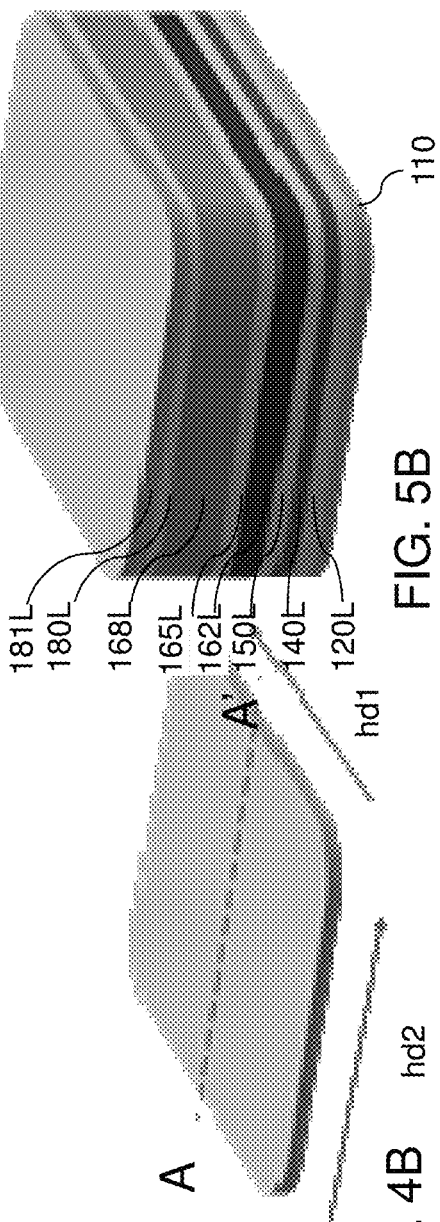
FIG. 4B is a perspective view of the first exemplary structure of FIG. 4A. The line A-A' is a line including the vertical cross-sectional plane of the view of FIG. 4A.

Referring to FIGS. 4A and 4B, a first exemplary embodiment structure for forming a two-dimensional array of phase change memory cells according to an embodiment of the present disclosure is illustrated. The first exemplary structure may include a substrate 9 and an insulating material layer 110 formed on a top surface of the substrate. For example, the substrate 9 may include a semiconductor substrate such as a silicon substrate, and the insulating material layer 110 may include a dielectric material such as silicon oxide, and may have a thickness in a range from 10 nm to 5,000 nm, although lesser and greater thicknesses may also be used. A first horizontal direction hd1 and a second horizontal direction hd2 are illustrated. The second horizontal direction hd2 may be perpendicular to the first horizontal direction hd1.

Figure 5A:
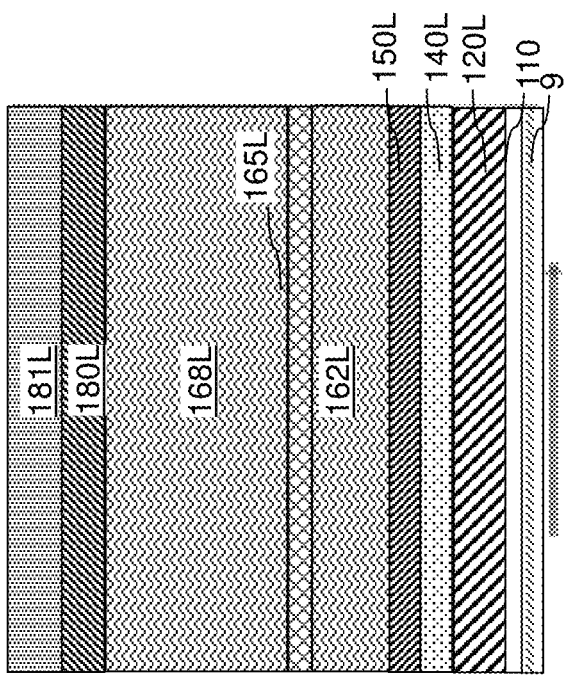
FIG. 5A is a vertical cross-sectional view of the first exemplary structure after formation of a layer stack including a first electrically conductive layer, a selector material layer, a first electrode material layer, a first phase change memory (PCM) material layer, an intermediate electrode material layer, a second PCM material layer, a second electrode material layer, and a hard mask layer according to an embodiment of the present disclosure.
Figure 5B:
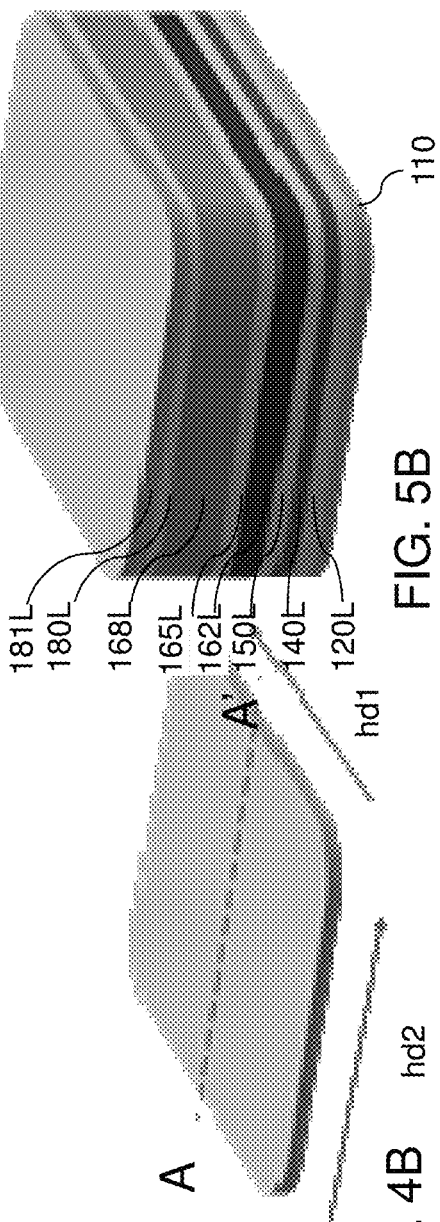
FIG. 5B is a perspective view of the first exemplary structure of FIG. 5A.

Referring to FIGS. 5A and 5B, a layer stack (120L, 140L, 150L, 162L, 165L, 168L, 180L, 181L) may be formed over the insulating material layer 110. The layer stack (120L, 140L, 150L, 162L, 165L, 168L, 180L, 181L) may include a first electrically conductive layer 120L, a selector material layer 140L, a first electrode material layer 150L, a first phase change memory (PCM) material layer 162L, an intermediate electrode material layer 165L, a second PCM material layer 168L, a second electrode material layer 180L, and a hard mask layer 181L.

The first electrically conductive layer 120L includes a conductive material such as a metal (e.g., tungsten, copper, TaN, TiN, Ru, etc), and may have a thickness in a range from 100 nm to 600 nm. Optionally, the first electrically conductive layer 120L may include a lower metallic liner (such as a first TiN liner), a metal layer, and an upper metallic liner (such as a second TiN layer).

The selector material layer 140L may include a non-Ohmic material that provides electrical connection of electrical isolation depending on the magnitude and/or the polarity of an externally applied voltage bias thereacross. In one embodiment, the selector material layer 140L may include at least one threshold switch material layer. The at least one threshold switch material layer may include any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) may be non-crystalline (for example, amorphous) in a high resistance state, and may remain non-crystalline (for example, remain amorphous) in a low resistance state during application of a voltage above its threshold voltage across the OTS material. The OTS material may revert back to the high resistance state when the high voltage above its threshold voltage is lowered below a critical holding voltage. Throughout the resistive state changes, the ovonic threshold switch material may remain non-crystalline (e.g., amorphous). In one embodiment, the ovonic threshold switch material may comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer may contain any ovonic threshold switch material. In one embodiment, the ovonic threshold switch material layer may include, and/or may consist essentially of, a GeSeAs alloy, a GeTeAs, a GeSeTeSe alloy, a GeSe alloy, a SeAs alloy, a GeTe alloy, or a SiTe alloy. The thickness of the selector material layer 140L may be in a range from 5 nm to 50 nm, although lesser and greater thicknesses may also be used.

The first electrode material layer 150L may include a first electrode material, which may be a metallic material such as an elemental metal, an intermetallic alloy, a conductive metal nitride, or conductive carbon. For example, the first electrode material layer 150L may include a conductive metallic nitride such as TiN, TaN, or WN, and may have a thickness in a range from 5 nm to 200 nm, although lesser and greater thicknesses may also be used.

The first PCM material layer 162L may include a first PCM material. As used herein, a "phase change memory material" refers to a material having at least two different phases providing different resistivity. The at least two different phases may be provided, for example, by controlling the rate of cooling from a heated state to provide an amorphous state having a higher resistivity and a polycrystalline state having a lower resistivity. In this case, the higher resistivity state of the phase change memory material may be achieved by faster quenching of the phase change memory material after heating to an amorphous state, and the lower resistivity state of the phase change memory material may be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer may include, and/or may consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the first PCM material layer 162L may be in a range from 10 nm to 100 nm, such as from 20 nm to 50 nm, although lesser and greater thicknesses may also be used.

The intermediate electrode material layer 165L includes an intermediate electrode material, which may be a metallic material such as an elemental metal, an intermetallic alloy, a conductive metal nitride, or conductive carbon. For example, the intermediate electrode material layer 165L may include a conductive metallic nitride such as TiN, TaN, or WN, and may have a thickness in a range from 5 nm to 200 nm, although lesser and greater thicknesses may also be used.

The second PCM material layer 168L may include any phase change memory material that may be used for the first PCM material layer 162L. The thickness of the second PCM material layer 168L may be in a range from 30 nm to 600 nm, such as from 60 nm to 300 nm, although lesser and greater thicknesses may also be used.

While the present disclosure is described using an embodiment in which the second PCM material layer 168L is thicker than the first PCM material layer 162L, embodiments are expressly contemplated herein in which the second PCM material layer 168L is thinner than the first PCM material layer 162L or has the same thickness as the first PCM material layer 162L. One of the second PCM material layer 168L and the first PCM material layer 162L has a greater resistance per unit area along the vertical direction than the other of the second PCM material layer 168L and the first PCM material layer 162L. The difference in the ratio of the resistance may be x.

The second electrode material layer 180L includes a second electrode material, which may be a metallic material such as an elemental metal, an intermetallic alloy, a conductive metal nitride, or conductive carbon. For example, the second electrode material layer 180L may include a conductive metallic nitride such as TiN, TaN, or WN, and may have a thickness in a range from 5 nm to 200 nm, although lesser and greater thicknesses may also be used.

The hard mask layer 181L includes a hard mask material such as silicon nitride or silicon oxide. The thickness of the hard mask layer 181L may be in a range from 50 nm to 1,000 nm, although lesser and greater thicknesses may also be used.

Referring to FIGS. 6A and 6B, a photoresist layer 187 may be applied over the hard mask layer 181L, and may be lithographically patterned to form a line and space pattern. In an illustrate example, each line pattern may laterally extend along the first horizontal direction hd1, and the line and space pattern may be repeated with periodicity along the second horizontal direction hd2. The photoresist layer 187 may be present within the areas of the line patterns, and is absent in the areas of the space patterns. The pitch of the line and space pattern may be in a range from 10 nm to 100 nm, and the width of each patterned strip of the photoresist layer 187 (i.e., each line pattern) may be in a range from 5 nm to 50 nm, although lesser and greater dimensions may also be used. FIG. 6A is a magnified view of a vertical cross section of the first exemplary structure after application and patterning of a photoresist layer according to an embodiment of the present disclosure. FIG. 6A illustrates a single rail of photoresist layer 187.

Referring to FIGS. 7A and 7B, an anisotropic etch process may be performed to transfer the pattern in the photoresist layer 187 through the hard mask layer 181L, the second PCM material layer 168L, the intermediate electrode material layer 165L, the first PCM material layer 162L into rail structures (162R, 165R, 168R, 180R, 181R) having vertical, or substantially vertical, sidewalls. The rail structures (162R, 165R, 168R, 180R, 181R) may include first PCM material rails 162R that are patterned portions of the first PCM material layer 162L, intermediate electrode material rails 165R that are patterned portions of the intermediate electrode material layer 165L, second PCM material rails 168R that are patterned portions of the second PCM material layer 168L, second electrode material rails 180R that are patterned portions of the second electrode material layer 180L, and hard mask rails 181R that are patterned portions of the hard mask layer 181L. The photoresist layer 187 may be subsequently removed, for example, by ashing.

Referring to FIGS. 8A and 8B, a resistive liner layer 170L and an optional dielectric liner layer 172L may be formed as conformal material layers. The resistive liner layer 170L may include a metallic nitride material such as TiN, TaN, or WN, a metallic carbide material such as TiC, TaC, or WC, a doped or undoped metal oxide such as hafnium oxide or aluminum oxide with optional dopants, silicon carbide, amorphous carbon, or a metallic oxynitride such as TiON, TaON, or WON. In one embodiment, the composition of the resistive liner layer 170L may be modulated by oxidation or nitridation. Alternatively, the resistive liner layer 170L may include an intrinsic semiconductor material or a doped semiconductor material having a low dopant concentration such as a dopant concentration in a range from $1.0 \times 10^{13}/\text{cm}^3$ to $1.0 \times 10^{16}/\text{cm}^3$. The thickness of the resistive liner layer 170L may be in a range from 2 nm to 50 nm, although lesser and greater thicknesses may also be used.

The dielectric liner layer 172L may include a dielectric material such as silicon oxide, silicon nitride, or a dielectric metal oxide. The thickness of the dielectric liner layer 172L may be in a range from 2 nm to 60 nm, although lesser and greater thicknesses may also be used.

Referring to FIGS. 9A and 9B, an anisotropic etch process may be performed to remove horizontal portions of the dielectric liner layer 172L and the resistive liner layer 170L. Each remaining vertical portion of the resistive liner layer 170L may constitute a resistive liner rail 170R, and each remaining vertical portion of the dielectric liner layer 172L constitutes a dielectric liner rail 172R.

Further, the anisotropic etch process may be continued to etch physically exposed portions of the first electrode material layer 150L, the selector material layer 140L, and the first electrically conductive layer 120L. Each patterned portion of the first electrode material layer 150L constitutes a first electrode rail 150R, each patterned portion of the selector material layer 140L constitutes a selector material rail 140R, and each patterned portion of the first electrically conductive layer 120L constitutes a first electrically conductive line 120. Each vertical stack of a first electrically conductive line 120, a selector material rail 140R, and a first electrode rail 150R may have vertically coincident sidewalls. As used herein, surfaces are vertically coincident if the surfaces overlie or underlie each other or one another and if a vertical plane exists that contains each of the surfaces. A one-dimensional periodic array of rail stacks (120, 140R, 150R, 162R, 165R, 168R, 180R, 181R, 170R, 172R) may be formed. Each rail stack (120, 140R, 150R, 162R, 165R, 168R, 180R, 181R, 170R, 172R) may laterally extend along the first horizontal direction hd1, and may be laterally spaced apart from other rail stacks (120, 140R, 150R, 162R, 165R, 168R, 180R, 181R, 170R, 172R) along the second horizontal direction hd2.

Figure 10A:
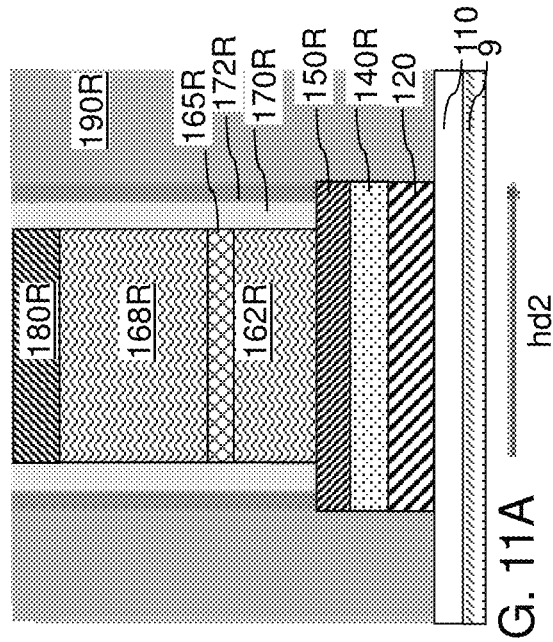
FIG. 10A is vertical cross-sectional view of the first exemplary structure after formation of a dielectric matrix layer according to an embodiment of the present disclosure.
Figure 10B:
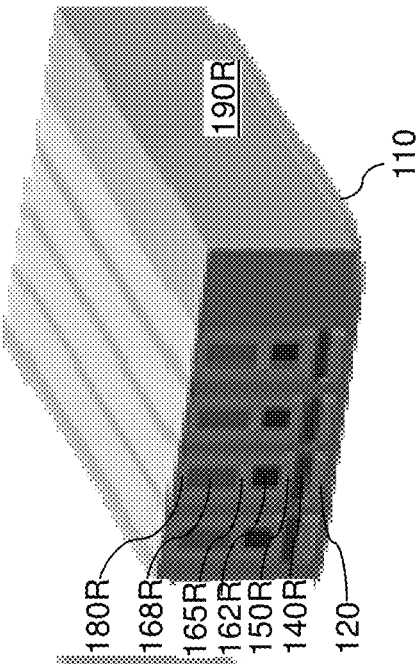
FIG. 10B is a perspective view of the first exemplary structure of FIG. 10A.

Referring to FIGS. 10A and 10B, a dielectric matrix layer 190L may be deposited over the array of rail stacks (120, 140R, 150R, 162R, 165R, 168R, 180R, 181R, 170R, 172R). The dielectric matrix layer 190L may fill spaces between neighboring pairs of rail stacks (120, 140R, 150R, 162R, 165R, 168R, 180R, 181R, 170R, 172R) and overlies the rail stacks (120, 140R, 150R, 162R, 165R, 168R, 180R, 181R, 170R, 172R). The dielectric matrix layer 190L may include a dielectric material such as silicon oxide.

Figure 11A:
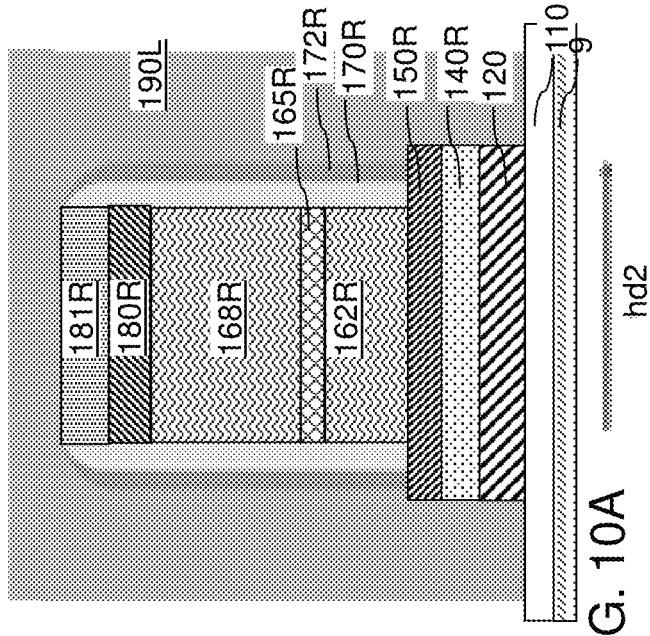
FIG. 11A is a vertical cross-sectional view of the first exemplary structure after planarization of the dielectric matrix layer and formation of dielectric rails according to an embodiment of the present disclosure.
Figure 11B:
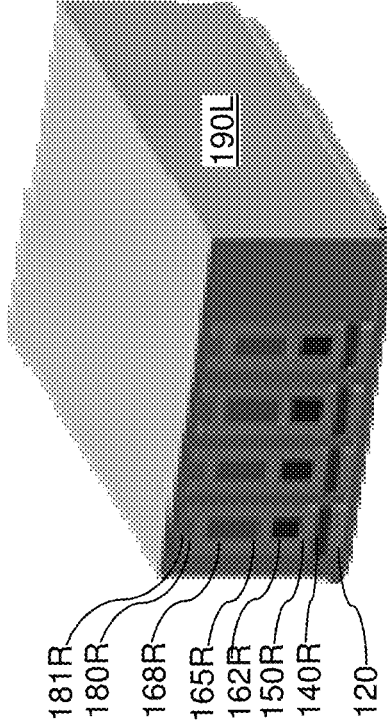
FIG. 11B is a perspective view of the first exemplary structure of FIG. 11A.

Referring to FIGS. 11A and 11B, a planarization process may be performed to remove portions of the dielectric matrix layer 190L that overlies the top surfaces of the second electrode material rails 180R. For example, a chemical mechanical planarization process may be performed using the second electrode material rails 180R as stopping structures. The hard mask rails 181R may be removed during the planarization process. Remaining portions of the dielectric matrix layer 190L include dielectric rails 190R that laterally extend along the first horizontal direction hd1.

Figure 12A:
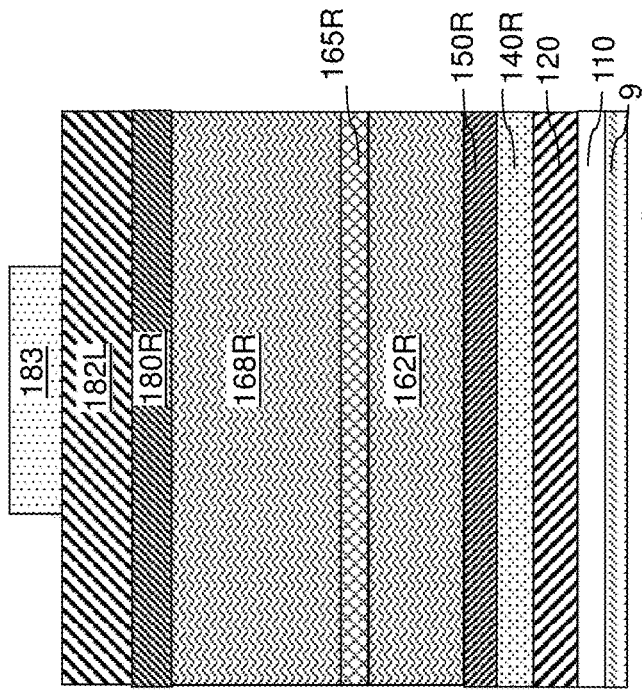
FIG. 12A is a vertical cross-sectional view of the first exemplary structure after formation of a second electrically conducive layer and a masking material layer according to an embodiment of the present disclosure.
Figure 12B:
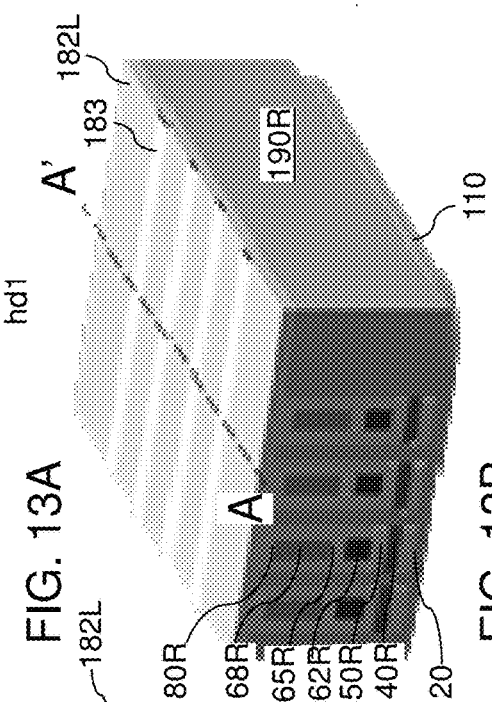
FIG. 12B is a perspective view of the first exemplary structure of FIG. 12A.

Referring to FIGS. 12A and 12B, a second electrically conducive layer 182L and a masking material layer 183L may be sequentially formed. The second electrically conductive layer 182L includes a conductive material such as a metal (e.g., tungsten or copper), and may have a thickness in a range from 100 nm to 600 nm. Optionally, the second electrically conductive layer 182L may include a lower metallic liner (such as a first TiN liner), a metal layer, and an upper metallic liner (such as a second TiN layer). The masking material layer 183L may include a photoresist layer or a hard mask material layer.

Figure 13A:
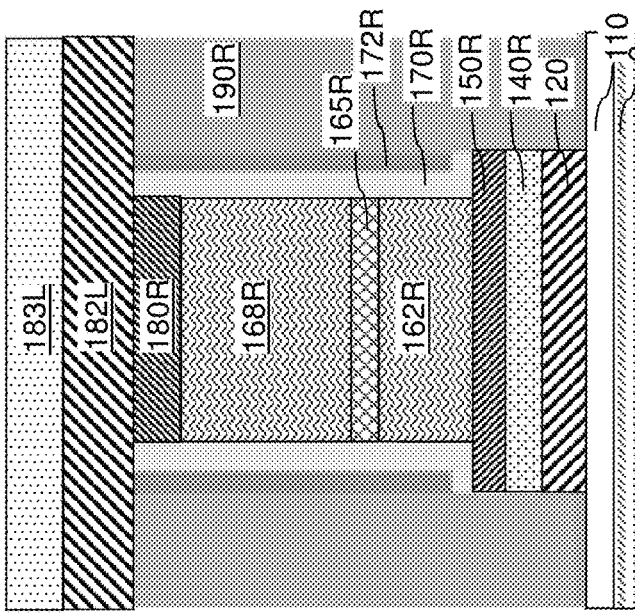
FIG. 13A is a vertical cross-sectional view of the first exemplary structure after patterning the masking material layer according to an embodiment of the present disclosure.
Figure 13B:
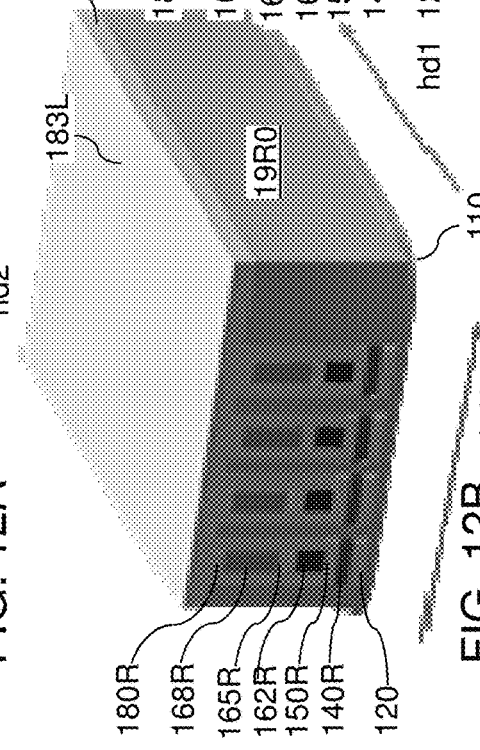
FIG. 13B is a perspective view of the first exemplary structure of FIG. 13A.

Referring to FIGS. 13A and 13B, the masking material layer 183L may be patterned with a line and space pattern to provide masking material strips 183 that laterally extend along the second horizontal direction. In an illustrate example, each masking material strip 183 may laterally extend along the second horizontal direction hd2, and the line and space pattern may be repeated with periodicity along the first horizontal direction hd1. The pitch of the line and space pattern may be in a range from 10 nm to 100 nm, and the width of each masking material strip 183 (i.e., each line pattern) may be in a range from 5 nm to 50 nm, although lesser and greater dimensions may also be used.

Figure 14A:
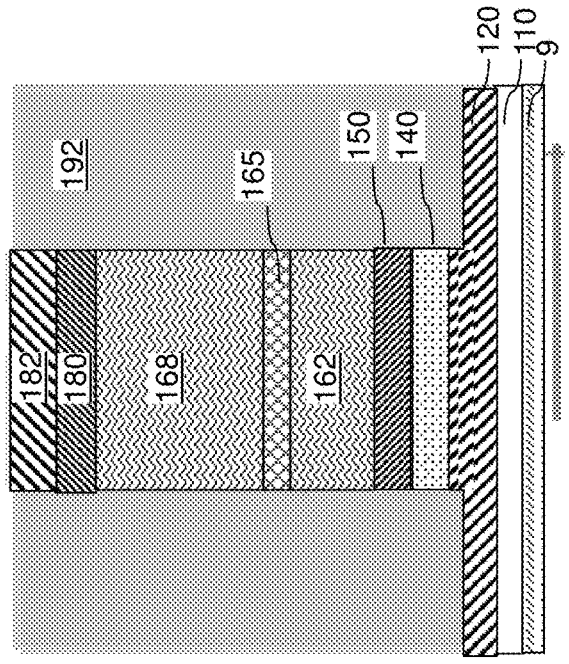
FIG. 14A is a vertical cross-sectional view of the first exemplary structure after formation of a two-dimensional array of pillar structures according to an embodiment of the present disclosure.
Figure 14B:
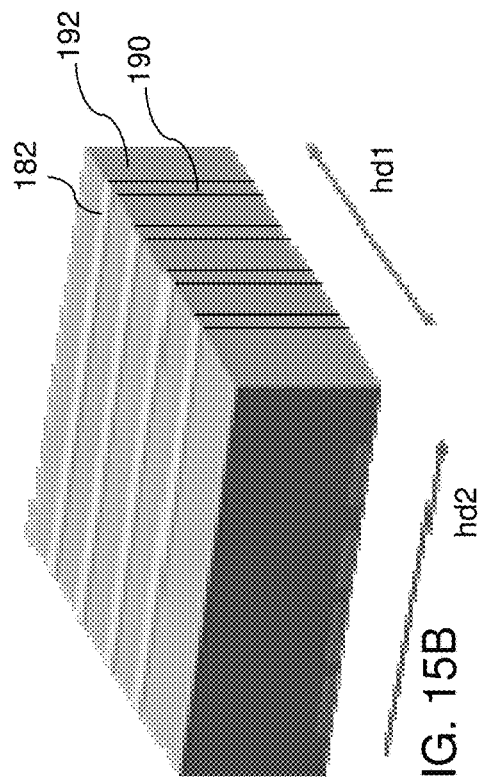
FIG. 14B is a perspective view of the first exemplary structure of FIG. 14A.

Referring to FIGS. 14A and 14B, the pattern in the masking material strips 183 may be transferred through the second electrically conductive layer 182L, the second electrode material rails 180R, the second PCM material rails 168R, the intermediate electrode material rails 165R, the first PCM material rails 162R, the first electrode rails 150R, the selector material rails 140R, the resistive liner rails 170R, the dielectric liner rails 170R, and the dielectric rails 190R. A terminal step of the anisotropic etch process may be selective to the material of the first electrically conductive lines 120.

Each remaining portion of the second electrically conductive layer 182L constitutes a second electrically conductive line 182. Each remaining portion of the second electrode material rails 180R constitutes a second electrode 180. Each remaining portion of the second PCM material rails 168R constitutes a second PCM material portion 168. Each remaining portion of the intermediate electrode material rails 165R constitutes an intermediate electrode 165. Each remaining portion of the first PCM material rails 162R constitutes a first PCM material portion 162. Each remaining portion of the first electrode rails 150R constitutes a first electrode 150. Each remaining portion of the selector material rails 140R constitutes a selector material portion 140. Each remaining portion of the resistive liner rails 170R constitutes a resistive liner 170. Each remaining portion of the dielectric liner rails 170R constitutes a dielectric liner 172. Each remaining portion of the dielectric rails 190R constitutes a dielectric pillar 190. A laterally alternating sequence of pillar structures (162, 165, 168) capped with the second electrode 180 and dielectric pillars 190 are formed underneath each second electrically conductive line 182.

A two-dimensional array of pillar structures (162, 165, 168) capped with the second electrodes 180 (i.e., capped pillar structures (162, 165, 168, 180) may be formed. Each pillar structure may include a vertical stack including, from bottom to top, a first PCM material portion 162, an intermediate electrode 165, a second PCM material portion 168, and a second electrode 180. In one embodiment, each capped pillar structure (162, 165, 168, 180) may have a same horizontal cross-sectional shape throughout and/or may be defined by four straight sidewalls that may be vertical or tapered. Generally, all rail structures within the rail stacks (120, 140R, 150R, 162R, 165R, 168R, 180R, 181R, 170R, 172R) may be divided along the second horizontal direction hd2. Each capped pillar structure (162, 165, 168, 180) comprises a respective set of divided portions of the rail stacks (120, 140R, 150R, 162R, 165R, 168R, 180R, 181R, 170R, 172R), and a resistive liner 170 for each multi-level phase change memory cell comprises a pair of divided portions of the resistive liner rails 170R located on a respective capped pillar structure (162, 165, 168, 180). In other words, a resistive liner 170 for a multi-level phase change memory cell comprising as two discrete resistive liner portions located on opposing sidewalls of a capped pillar structure (162, 165, 168, 180) of the multi-level phase change memory cell. The masking material strips 183 may be subsequently removed, for example, by ashing.

Figure 15A:
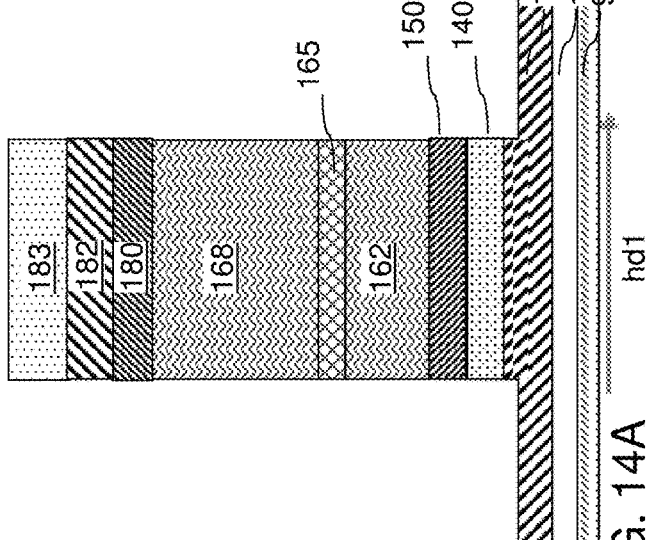
FIG. 15A is a vertical cross-sectional view of the first exemplary structure after formation of dielectric fill material portions according to an embodiment of the present disclosure.
Figure 15B:
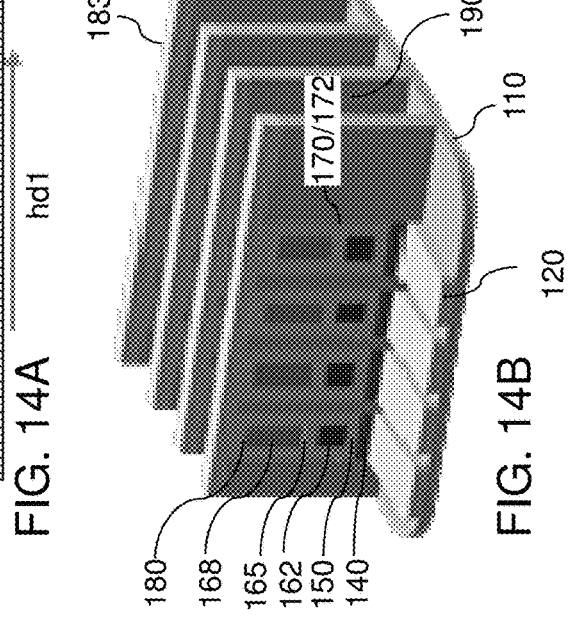
FIG. 15B is a perspective view of the first exemplary structure of FIG. 15A.

Referring to FIGS. 15A and 15B, dielectric fill material portions 192 may be formed by depositing a dielectric fill material such as silicon oxide in the gaps between neighboring pairs of laterally alternating sequences of capped pillar structures (162, 165, 168, 180) and dielectric pillars 190. Each dielectric fill material portion 192 may laterally extend along the second horizontal direction hd2 with a uniform vertical cross-sectional shape within vertical planes that are perpendicular to the second horizontal direction hd2.

Figure 16A:
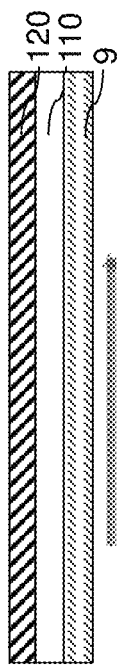
FIG. 16A is a vertical cross-sectional view of a second exemplary structure for forming a two-dimensional array of phase change memory cells after formation of first electrically conductive lines formed within a dielectric material layer according to an embodiment of the present disclosure.
Figure 16B:
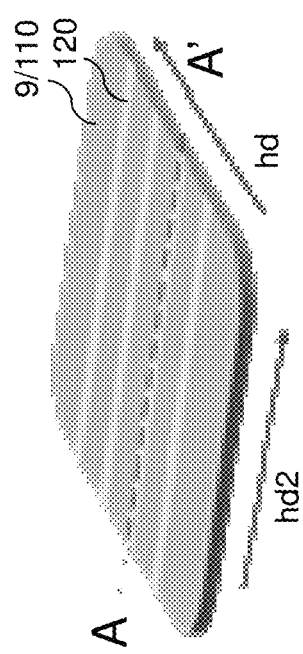
FIG. 16B is a perspective view of the second exemplary structure of FIG. 16A. The line A-A' is a line including the vertical cross-sectional plane of the view of FIG. 16A.

Referring to FIGS. 16A and 16B, a second exemplary embodiment structure for forming a two-dimensional array of phase change memory cells may be derived from the first exemplary structure of FIGS. 4A and 4B by forming first electrically conductive lines 120 that laterally extend along the second horizontal direction hd2. The first electrically conductive lines 120 in the second exemplary structure may have the same material composition and the same thickness as the first electrically conductive lines 120 in the first exemplary structure.

Figure 17A:
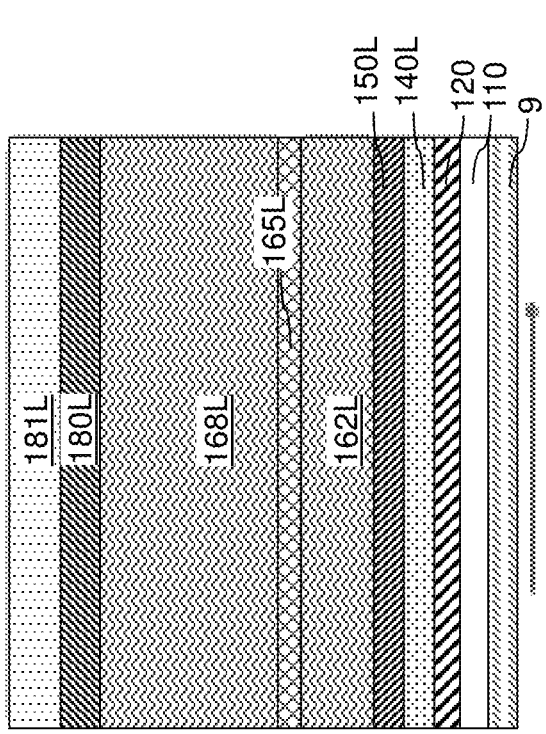
FIG. 17A is a vertical cross-sectional view of the second exemplary structure after formation of a layer stack including a selector material layer, a second electrode material layer, a second phase change memory (PCM) material layer, an intermediate electrode material layer, a second PCM material layer, a second electrode material layer, and a hard mask layer according to an embodiment of the present disclosure.
Figure 17B:
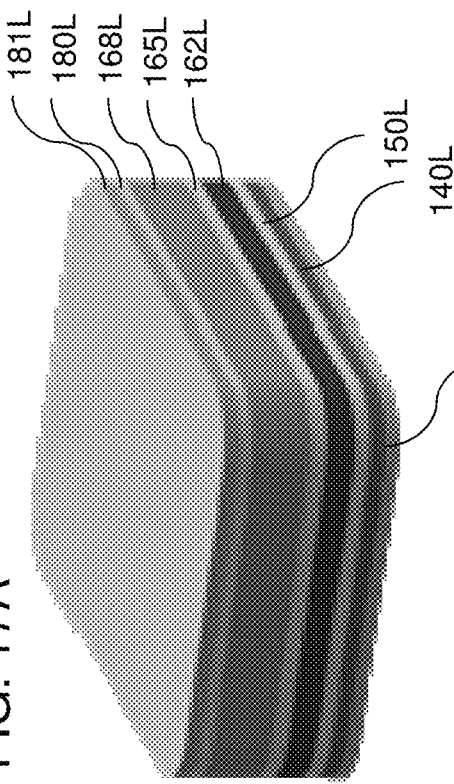
FIG. 17B is a perspective view of the second exemplary structure of FIG. 17A.

Referring to FIGS. 17A and 17B, the processing steps of FIGS. 5A and 5B may be performed to form a layer stack (140L, 150L, 162L, 165L, 168L, 180L, 181L) including a selector material layer 140L, a first electrode material layer 150L, a first phase change memory (PCM) material layer 162L, an intermediate electrode material layer 165L, a second PCM material layer 168L, a second electrode material layer 180L, and a hard mask layer 181L. Each layer within the layer stack (140L, 150L, 162L, 165L, 168L, 180L, 181L) may have the same composition as, and the same thickness as, in the first exemplary structure.

Referring to FIGS. 18A and 18B, a photoresist layer 187 may be applied over the layer stack (140L, 150L, 162L, 165L, 168L, 180L, 181L), and may be lithographically patterned to form a two-dimensional periodic array of discrete photoresist material portions. The pitch of the two-dimensional periodic array of discrete photoresist material portions along the first horizontal direction hd1 may be in a range from 10 nm to 100 nm, although lesser and greater pitches may also be used. The pitch of the two-dimensional periodic array of discrete photoresist material portions along the first second horizontal direction hd2 may be in a range from 10 nm to 100 nm, although lesser and greater pitches may also be used. The lateral dimension of each discrete photoresist material portion may be in a range from 5 nm to 50 nm, although lesser ad greater dimensions may also be used. Each row of discrete photoresist material portions that are arranged along the second horizontal direction may be located within the area of a respective one of the first electrically conductive lines 120. The photoresist layer 187 may be subsequently removed, for example, by ashing.

Referring to FIGS. 19A and 19B, an anisotropic etch process may be performed to transfer the pattern of the two-dimensional periodic array of discrete photoresist material portions through the hard mask layer 181L, the second PCM material layer 168L, the intermediate electrode material layer 165L, and the first PCM material layer 162L. Each patterned portion of the hard mask layer 181L constitutes a hard mask portion 181. Each patterned portion of the second electrode material layer 180L constitutes a second electrode 180. Each patterned portion of the second PCM material layer 168L constitutes a second PCM material portion 168. Each patterned portion of the intermediate electrode material layer 165L constitutes an intermediate electrode 165. Each patterned portion of the first PCM material layer 162L constitutes a first PCM material portion 162. Generally, a two-dimensional array of pillar structures 20 may be formed by depositing and patterning a layer stack including a first PCM material layer 162L, an intermediate electrode material layer 165L, and a second PCM material layer 168L.

Referring to FIGS. 20A and 20B, a resistive liner layer 170L and an optional dielectric liner layer 172L may be formed as conformal material layers. The resistive liner layer 170L may include a metallic nitride material such as TiN, TaN, or WN, a metallic carbide material such as TiC, TaC, or WC, a doped or undoped metal oxide such as hafnium oxide or aluminum oxide with optional dopants, silicon carbide, amorphous carbon, or a metallic oxynitride such as TiON, TaON, or WON. In one embodiment, the composition of the resistive liner layer 170L may be modulated by oxidation or nitridation. Alternatively, the resistive liner layer 170L may include an intrinsic semiconductor material or a doped semiconductor material having a low dopant concentration such as a dopant concentration in a range from $1.0 \times 10^{13}/\text{cm}^3$ to $1.0 \times 10^{16}/\text{cm}^3$. The thickness of the resistive liner layer 170L may be in a range from 2 nm to 50 nm, although lesser and greater thicknesses may also be used.

The dielectric liner layer 172L includes a dielectric material such as silicon oxide, silicon nitride, or a dielectric metal oxide. The thickness of the dielectric liner layer 172L may be in a range from 2 nm to 60 nm, although lesser and greater thicknesses may also be used.

Referring to FIGS. 21A and 21B, an anisotropic etch process may be performed to remove horizontal portions of the dielectric liner layer 172L and the resistive liner layer 170L. Each remaining vertical portion of the resistive liner layer 170L constitutes a resistive liner 170, and each remaining vertical portion of the dielectric liner layer 172L constitutes a dielectric liner 172. Each resistive liner 170 and each dielectric liner 172 may have a tubular configuration.

Further, the anisotropic etch process may be continued to etch physically exposed portions of the first electrode material layer 150L and the selector material layer 140L, and the first electrically conductive layer 120L. Each patterned portion of the first electrode material layer 150L constitutes a first electrode 150, and each patterned portion of the selector material layer 140L constitutes a selector material portion 140. Each vertical stack of a selector material rail 140R and a first electrode rail 150R may have vertically coincident sidewalls. In one embodiment, the resistive liners 170 may be formed by conformally depositing and anisotropically etching a material having electrical resistivity that is higher than electrical resistivity of the first PCM material layer 162L in a crystalline phase and is lower than electrical resistivity of the first PCM material layer 162L in an amorphous phase.

Referring to FIGS. 22A and 22B, a dielectric matrix layer 290 may be deposited over the two-dimensional array of capped pillar structures (162, 165, 168, 180, 181). The dielectric matrix layer 290 fills spaces between the capped pillar structures (162, 165, 168, 180, 181). The dielectric matrix layer 290 includes a dielectric material such as silicon oxide.

Referring to FIGS. 23A and 23B, a planarization process may be performed to remove portions of the dielectric matrix layer 290 that overlies the top surfaces of the second electrodes 180. For example, a chemical mechanical planarization process may be performed using the second electrodes 180 as stopping structures. The hard mask portions 181 may be removed during the planarization process. Each pillar structure includes a vertical stack of a first PCM material portion 162, an intermediate electrode 165, a second PCM material portion 168, and a second electrode 180. Remaining portions of the dielectric matrix layer 290 laterally surround remaining portions of the capped pillar structures (162, 165, 168, 180).

Referring to FIGS. 24A and 24B, a second electrically conducive layer may be deposited and patterned to form second electrically conducive lines 182 that laterally extend along the first horizontal direction hd1. The second electrically conductive lines 182 includes a conductive material such as a metal (e.g., tungsten or copper), and may have a thickness in a range from 100 nm to 600 nm. Optionally, each of the second electrically conductive lines 182 may include a lower metallic liner (such as a first TiN liner), a metal layer, and an upper metallic liner (such as a second TiN layer).

Referring to all drawings and according to various embodiments of the present disclosure, a plurality of first electrically conductive lines 120 may be formed over a substrate 9/110. First electrodes 150 may be formed on, or as a portion of, a respective one of the first electrically conductive layers 120. A two-dimensional array of capped pillar structures (162, 165, 168, 180) may be formed over the first electrically conductive lines 120 and over the first electrodes 150. The two-dimensional array of capped pillar structures (162, 165, 168, 180) comprises multiple instances of a capped pillar structure (162, 165, 168, 180) having a same set of structural components. A two-dimensional array of resistive liners 170 may be formed on the two-dimensional array of capped pillar structures (162, 165, 168, 180). A plurality of second electrically conductive lines 182 may be formed over the two-dimensional array of capped pillar structures (162, 165, 168, 180). The second electrically conductive lines 182 may be formed on, or may include, a respective set of the second electrodes 180.

Generally, a memory device comprising at least one phase change memory cell is provided. The phase change memory cell includes a first electrode located 150 over a substrate (9/110), a second electrode 180 located over the first electrode 150, a pillar structure (162, 165, 168) located between the first and second electrodes and extending along a vertical direction perpendicular to the substrate, the pillar structure containing a first phase change memory (PCM) material portion 162, a second PCM material portion 168 and an intermediate electrode 165 located between the first PCM material portion and the second PCM material portion, and a resistive liner 170 containing a first segment 170A electrically connected in parallel to the first PCM material portion 162 between the first electrode 150 and the intermediate electrode 165, and a second segment 170B electrically connected in parallel to the second PCM material portion 168 between the intermediate electrode 165 and the second electrode 180. The first PCM material portion has a different electrical resistance than the second PCM material portion, and the first segment of the resistive liner has a different electrical resistance than the second segment of the resistive liner.

In one embodiment, the first segment 170A may physically contact at least one sidewall of the first PCM material portion 162, and the second segment 170B may physically contact at least one sidewall of the second PCM material portion 168. In another embodiment, the first segment 170A may be offset from and not physically contact at least one sidewall of the first PCM material portion 162, and/or the second segment 170B may be offset from and not physically contact at least one sidewall of the second PCM material portion 168.

In one embodiment, the resistive liner 170 extends between a periphery of a distal horizontal surface of the first PCM material portion 162 to a periphery of a distal horizontal surface of the second PCM material portion 168. As used herein, a proximal horizontal surface of the first PCM material portion 162 refers to the horizontal surface of the first PCM material portion 162 that contacts the intermediate electrode 165, and a distal horizontal surface of the first PCM material portion 162 refers to the horizontal surface of the first PCM material portion 162 that does not contact the intermediate electrode 165. Likewise, a proximal horizontal surface of the second PCM material portion 168 refers to the horizontal surface of the second PCM material portion 168 that contacts the intermediate electrode 165, and a distal horizontal surface of the second PCM material portion 168 refers to the horizontal surface of the second PCM material portion 168 that does not contact the intermediate electrode 165.

In one embodiment, the electrical resistance along the vertical direction of the first segment of the resistive liner 170 is greater than electrical resistance of a crystalline state of the second PCM material portion 168.

In one embodiment, the electrical resistance along the vertical direction of the crystalline state of the second PCM material portion 168 is x times the electrical resistance along the vertical direction of the crystalline state of the first PCM material portion 162, and x is greater than 1.

In one embodiment, electrical resistance along the vertical direction of the first segment of the resistive liner 170 is y times the electrical resistance along the vertical direction of the crystalline state of the first PCM material portion 168, and y is greater than x, such that electrical resistance along the vertical direction of the first segment 170A of the resistive liner 170 is greater than the electrical resistance of the crystalline state of the second PCM material portion 168, and the electrical resistance along the vertical direction of the second segment 170B of the resistive liner 170 is greater than the electrical resistance along the vertical direction of the first segment 170A of the resistive liner 170.

In one embodiment, electrical resistance along the vertical direction of the amorphous state of the first PCM material portion 162 is n times the electrical resistance along the vertical direction of the crystalline state of the first PCM material portion 162; and n is greater than y.

In an illustrative example, x is in a range from 1.5 to 20; y is in a range from 1.5 to 400; and n is in a range from 10 to 1,000,000.

In one embodiment the electrical resistance along the vertical direction of a first segment of the resistive liner 170 located on the first PCM material portion 162 is less than electrical resistance along the vertical direction of an amorphous state of the first PCM material portion 162, is less than electrical resistance along the vertical direction of an amorphous state of the second PCM material portion 168, and is greater than electrical resistance along the vertical direction of a crystalline state of the first PCM material portion 162.

In one embodiment, sidewalls of the second PCM material portion 168, the intermediate electrode 165, and the first PCM material portion 162 are vertically coincident.

In one embodiment, each of the at least one phase change memory cell has a rectangular horizontal cross-sectional shape as illustrated in the first exemplary structure.

In one embodiment, each of the at least one phase change memory cell has a horizontal cross-sectional shape that is elected from a circle, an oval, and a rounded rectangle as illustrated in the second exemplary structure.

In one embodiment, the resistive liner 170 comprises two physically disjoined strips that are laterally spaced apart along a horizontal direction (as illustrated in the first exemplary structure); and each of the first PCM material portion 162, the intermediate electrode 165, and the second PCM material portion 168 comprises two sidewalls that contact dielectric fill material portions 192.

In one embodiment, all sidewall areas of the first PCM material portion 162, the intermediate electrode 165, and the second PCM material portion 168 are contacted by the resistive liner 170 as in the second exemplary structure.

In one embodiment, the at least one phase change memory cell comprises a selector material portion 140 located on one of the first electrode 150 and the second electrode 180.

In one embodiment, the at least one phase change memory cell comprises a two-dimensional periodic array of phase change memory cells arranged in a cross-point array configuration.

In one embodiment, each phase change memory cell comprises a selector material portion 140 connected in a series connection with a respective pillar structure (162, 165, 168, 180) at each cross point between first electrically conductive lines 120 extending along one direction and second electrically conductive lines 182 extending along another direction.

Each multilevel phase change memory cell of the embodiments of the present disclosure has multiple discrete confined volumes of at least one phase change material. The discrete, physically isolated volumes of the at least one phase change material make it easy to reproducibly separate the resistance states associated with each of the binary states of a respective phase change memory material portion by providing discrete resistance states through segments of a resistive liner 170. The multilevel phase change memory cell of the present disclosure provides a high-performance multilevel memory cell that reduces or eliminates the need for incremental step pulse programming.

Without wishing to be bound by a particular theory, it is believed that by using pulses with a predetermined length and/or intensity, both the first PCM material portion 162 and the second PCM material portion 168 may be changed from their amorphous state to their crystalline state, or the second PCM material portion 168 may be changed from its amorphous state to its crystalline state, while the first PCM material portion 162 remains in its amorphous state. Likewise, by using pulses with a different predetermined length and/or intensity, both the first PCM material portion 162 and the second PCM material portion 168 may be changed from their crystalline state to their amorphous state, or the second PCM material portion 168 may be changed from its crystalline state to its amorphous state, while the first PCM material portion 162 remains in its crystalline state.

Without wishing to be bound by a particular theory, it is believed that when the first and second PCM material portions are in different crystallinity states (e.g., when the first PCM material portion 162 and the second PCM material portion 168 are in their respective amorphous and crystalline states), then programming these PCM material portions into the opposite crystallinity states (e.g., such that the first PCM material portion 162 and the second PCM material portion 168 are in their respective crystalline and amorphous states) may be carried out using two different methods.

In a first method, engineering both the materials in each volume of and the shape of the writing pulse may be used for such programming. For example, the programming is started with a slow programming pulse at an intermediate current to crystallize the first PCM material portion 162 followed by increasing the programming current in a quicker pulse which is sufficient to only amorphize the second PCM material portion 168.

In a second method, a two-pulse writing method may be used. In this second method, the default condition would be applying a generic pulse to either amorphize or crystallize both the first and the second PCM material portions (162, 168) regardless of their crystallinity state. Then, a programming pulse is applied that provides the desired crystallinity state to either or both PCM material portions (162, 168). The use of two programming pulses would still be faster than using ISPP described above.

In one embodiment, the intermediate electrode 165 is not electrically connected to a separate outside lead, and the programming is carried out by applying a desired voltage and/or current between the first and second electrodes (150, 180). In another embodiment, the intermediate electrode 165 is electrically connected to a separate outside lead, and the programming is carried out by applying a desired voltage and/or current between the first and second electrodes (150, 180) and/or between the intermediate electrode 165 and one or both of the first and second electrodes (150, 180).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising at least one phase change memory cell, wherein the at least one phase change memory cell comprises:
   a first electrode located over a substrate;
   a second electrode located over the first electrode;
   a pillar structure located between the first and second electrodes and extending along a vertical direction perpendicular to the substrate, the pillar structure comprising a first phase change memory (PCM) material portion, a second PCM material portion and an intermediate electrode located between the first PCM material portion and the second PCM material portion; and
   a resistive liner comprising a first segment electrically connected in parallel to the first PCM material portion between the first electrode and the intermediate electrode, and a second segment electrically connected in parallel to the second PCM material portion between the intermediate electrode and the second electrode;

wherein:
   the first PCM material portion has a different electrical resistance than the second PCM material portion; and
   the first segment of the resistive liner has a different electrical resistance than the second segment of the resistive liner;
   the electrical resistance along the vertical direction of a crystalline state of the second PCM material portion is x times the electrical resistance along the vertical direction of a crystalline state of the first PCM material portion, and x is greater than 1;
   the electrical resistance along the vertical direction of the first segment of the resistive liner is y times the electrical resistance along the vertical direction of the crystalline state of the first PCM material portion;
   y is greater than x, such that electrical resistance along the vertical direction of the first segment of the resistive liner is greater than the electrical resistance of the crystalline state of the second PCM material portion; and
   the electrical resistance along the vertical direction of the second segment of the resistive liner is greater than the electrical resistance along the vertical direction of the first segment of the resistive liner.

2. The memory device of claim 1, wherein:
   electrical resistance along the vertical direction of the amorphous state of the first PCM material portion is n times the electrical resistance along the vertical direction of the crystalline state of the first PCM material portion; and
   n is greater than y.

3. The memory device of claim 2, wherein:
   x is in a range from 1.5 to 20;
   y is in a range from 1.5 to 400; and
   n is in a range from 10 to 1,000,000.

4. The memory device of claim 2, wherein the electrical resistance along the vertical direction of a first segment of the resistive liner located on the first PCM material portion is less than electrical resistance along the vertical direction of an amorphous state of the first PCM material portion, is less than electrical resistance along the vertical direction of an amorphous state of the second PCM material portion, and is greater than electrical resistance along the vertical direction of a crystalline state of the first PCM material portion.

* * * * *